US012660173B2

(12) United States Patent
Choi et al.

(10) Patent No.: US 12,660,173 B2
(45) Date of Patent: Jun. 16, 2026

(54) INTEGRATED CIRCUIT DEVICE

(71) Applicant: Samsung Electronics Co., Ltd.,
Suwon-si (KR)

(72) Inventors: Jinseo Choi, Suwon-si (KR); Sohyang Lee, Suwon-si (KR); Jeongmin Jin, Suwon-si (KR); Sohee Choi, Suwon-si (KR)

(73) Assignee: Samsung Electronics Co., Ltd.,
Suwon-si (KR)

( * ) Notice: Subject to any disclaimer, the term of this patent is extended or adjusted under 35 U.S.C. 154(b) by 401 days.

(21) Appl. No.: 18/341,156

(22) Filed: Jun. 26, 2023

(65) Prior Publication Data

US 2024/0155832 A1     May 9, 2024

(30) Foreign Application Priority Data

Nov. 8, 2022     (KR) ......................... 10-2022-0148192

(51) Int. Cl.
*H10B 12/00*         (2023.01)
(52) U.S. Cl.
CPC ....... *H10B 12/482* (2023.02); *H10B 12/0335* (2023.02); *H10B 12/315* (2023.02)
(58) Field of Classification Search
CPC ............................ H10B 12/482; H10B 12/315
See application file for complete search history.

(56) References Cited

U.S. PATENT DOCUMENTS 9,064,731 B2     6/2015   Park
9,379,114 B2     6/2016   Jeong et al.

| | | | |
|---|---|---|---|
| 10,128,252 | B2 | 11/2018 | Lee et al. |
| 10,332,831 | B2 | 6/2019 | Hong et al. |
| 11,251,188 | B2 | 2/2022 | Kim et al. |
| 11,270,885 | B2 | 3/2022 | Lee et al. |
| 11,329,050 | B2 * | 5/2022 | Seong ................... H10B 12/053 |
| 2018/0175045 | A1 | 6/2018 | Lee et al. |
| 2021/0273048 | A1 * | 9/2021 | Park ..................... H10D 64/031 |
| 2022/0037251 | A1 | 2/2022 | Park et al. |
| 2022/0122986 | A1 | 4/2022 | Jang et al. |
| 2022/0139921 | A1 * | 5/2022 | Kim ..................... H10B 12/315 |
| | | | 257/532 |
| 2023/0200054 | A1 * | 6/2023 | Lee ..................... H01L 23/5283 |
| | | | 257/295 |

FOREIGN PATENT DOCUMENTS

TW          I792617 B       2/2023

* cited by examiner

*Primary Examiner* — Steven M Page
(74) *Attorney, Agent, or Firm* — Wolf, Greenfield & Sacks, P.C.

(57)          ABSTRACT

An integrated circuit device includes a bit line, an insulating capping pattern on the bit line and having an upper cutout portion, an insulating spacer on sidewalls of the bit line and the insulating capping pattern, a lower contact, a recess contact plug connected to the lower contact, an engraved insulating pattern on the insulating capping pattern and the recess contact plug and having a first portion, a second portion, and an opening, the first portion contacting a top surface of the insulating capping pattern, except for the upper cutout portion, the second portion being on a top surface of the recess contact plug, and the opening being defined by the first portion and the second portion, and a conductive landing pad in the opening of the engraved insulating pattern and having a lower corner portion contacting the upper cutout portion and a surface contacting the recess contact plug.

20 Claims, 37 Drawing Sheets

DCH
DC
212
A1
A1
T1
210

A – A'

MCA

Z
Y⊗→X

A – A'

MCA 244
236
234
232
230
222 { 222B
      222A
DCH
DC
212
A1
A1
T1
210

A – A'

MCA

Z
Y ⊗ → X

A – A'

MCA 250A
244A
236B
234
232
230
222 { 222B
      222A
DCH
DC
212
A1
A1
T1
210

A – A'

Z

MCA

Y ⊗ → X 262
252
250A
244A
236B
258A
256
BL { 234B
     232B
     230B
222 { 222B
     222A
RS
DC
212
A1
A1
T1
210

A – A'

MCA

Z
Y⊗→X 272
270P
262R
252
250A
244A
236B
258A
256
234B
232B  } BL
230B
210

A – A'

MCA

Z
Y⊗→X

A – A'

MCA

A – A'

MCA

A – A'

MCA 272
270P
262R
252
250A
244A
236B
258A
256
BL { 234B
    232B
    230B
210

A – A'

MCA

A – A'

MCA

INTEGRATED CIRCUIT DEVICE

CROSS-REFERENCE TO RELATED APPLICATION

This application is based on and claims priority under 35 U.S.C. § 119 to Korean Patent Application No. 10-2022-0148192, filed on Nov. 8, 2022, in the Korean Intellectual Property Office, the disclosure of which is incorporated by reference herein in its entirety.

BACKGROUND

The inventive concept relates to an integrated circuit (IC) device, and more particularly, to an IC device including a conductive landing pad.

Due to the development of electronics technology, the downscaling of IC devices has rapidly progressed, and the feature size of the IC devices has been reduced or miniaturized. Accordingly, new structure capable of improving the electrical reliability of conductive patterns formed in a narrow region.

SUMMARY

The inventive concept provides an integrated circuit (IC) device, which may have a structure capable of improving the electrical reliability of a conductive landing pad in a device region having a reduced area due to, for example, the downscaling trend.

According to an aspect of the inventive concept, there is provided an IC device including a bit line on a substrate, an insulating capping pattern on a top surface of the bit line, the insulating capping pattern having an upper cutout portion apart from the bit line in a vertical direction generally perpendicular to a top surface of the substrate, an insulating spacer on a sidewall of each of the bit line and the insulating capping pattern, a lower contact plug connected to an active region of the substrate, the lower contact plug being apart from the bit line in a first lateral direction perpendicular to the vertical direction with the insulating spacer therebetween, a recess contact plug connected to the lower contact plug on the lower contact plug, the recess contact plug being apart from the insulating capping pattern in the first lateral direction with the insulating spacer therebetween, an engraved insulating pattern on the insulating capping pattern and the recess contact plug, the engraved insulating pattern having a first portion, a second portion, and an opening, the first portion being in contact with a top surface of a region of the insulating capping pattern, for except for the upper cutout portion, the second portion being on a first portion of a top surface of the recess contact plug, and the opening being defined by the first portion and the second portion, and a conductive landing pad in the opening of the engraved insulating pattern, the conductive landing pad having a lower corner portion in contact with the upper cutout portion of the insulating capping pattern and a surface in contact with a second portion of the top surface of the recess contact plug.

According to another aspect of the inventive concept, there is provided an IC device including a plurality of bit line structures parallel to each other on a substrate, each bit line structure including a bit line, an insulating capping pattern, and an insulating spacer, the insulating capping pattern being on a top surface of the bit line and having an upper cutout portion apart from the bit line in a vertical direction generally perpendicular to a top surface of the substrate, and the insulating spacer being on a sidewall of each of the bit line and the insulating capping pattern, a plurality of lower contact plugs connected to an active region of the substrate, the plurality of lower contact plugs being between the plurality of bit line structures, respectively, a plurality of recess contact plugs on the plurality of lower contact plugs between the plurality of bit line structures, respectively, the plurality of recess contact plugs being connected to the plurality of lower contact plugs, respectively, an engraved insulating pattern on the plurality of bit line structures and the plurality of recess contact plugs, the engraved insulating pattern having a plurality of openings, and a plurality of conductive landing pads inside the plurality of openings of the engraved insulating pattern, the plurality of conductive landing pads being connected to the plurality of recess contact plugs, respectively, wherein each of the plurality of conductive landing pads includes a lower corner portion and a conductive landing pad, the lower corner portion being in contact with the upper cutout portion of the insulating capping pattern included in a selected one of the plurality of bit line structures, the conductive landing pad having a surface in contact with a top surface of a selected one of the plurality of recess contact plugs.

According to another aspect of the inventive concept, there is provided an IC device including a lower contact plug on a substrate, the lower contact plug being connected to an active region of the substrate, a pair of bit lines on both sides, respectively, of the lower contact plug at positions apart from the lower contact plug in a first lateral direction, the pair of bit lines extending lengthwise in a second lateral direction, wherein the second lateral direction intersects with the first lateral direction, a pair of insulating capping patterns on top surfaces of the pair of bit lines, a pair of insulating spacers on both sides of the lower contact plug, respectively, the pair of insulating spacers being on sidewalls of the pair of bit lines and sidewalls of the pair of insulating capping patterns, respectively, a recess contact plug connected to the lower contact plug on the lower contact plug, the recess contact plug being apart from the pair of insulating capping patterns in the first lateral direction, an engraved insulating pattern on the pair of insulating capping patterns, the pair of insulating spacers, and the recess contact plug, the engraved insulating pattern having an opening at a position overlapping each of a portion of a first insulating capping pattern selected from the pair of insulating capping patterns and a portion of the recess contact plug in a vertical direction, the vertical direction being generally perpendicular to a top surface of the substrate and being perpendicular to the first and second lateral directions, and a conductive landing pad in the opening of the engraved insulating pattern, the conductive landing pad having a lowermost surface that is closer to the substrate than an uppermost surface of the pair of insulating capping patterns, wherein the first insulating capping pattern includes an upper cutout portion that is apart from the bit line in the vertical direction, the upper cutout portion being concave toward the conductive landing pad, wherein the conductive landing pad is in contact with the upper cutout portion of the first insulating capping pattern and includes a lower corner portion and a surface that is in contact with a top surface of the recess contact plug, wherein the lower corner portion has a shape corresponding to the upper cutout portion of the first insulating capping pattern and is convex toward the upper cutout portion.

BRIEF DESCRIPTION OF THE DRAWINGS

Embodiments, of the inventive concept will be more clearly understood from the following detailed description taken in conjunction with the accompanying drawings in which:

FIG. 1 is a block diagram of an example configuration of an integrated circuit (IC) device, according to embodiments;

DETAILED DESCRIPTION OF THE EMBODIMENTS

Figure 2:
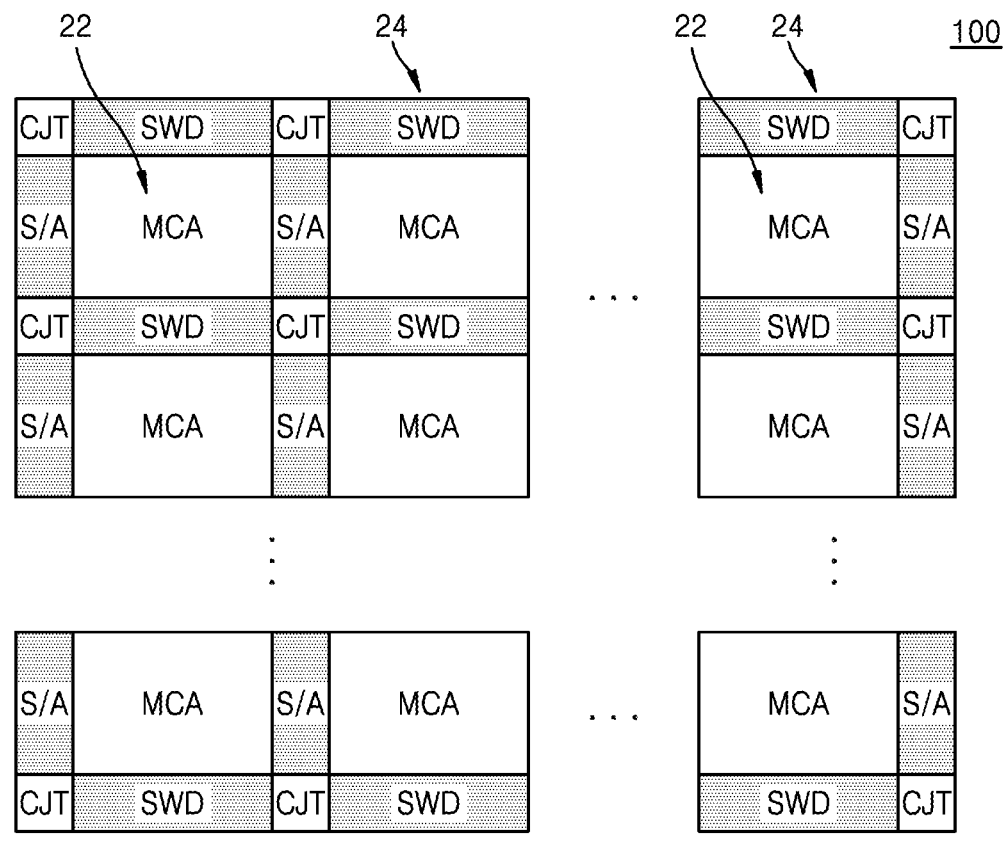
FIG. 2 is a plan view of an example arrangement of the IC device shown in FIG. 1.

Hereinafter, embodiments will be described in detail with reference to the accompanying drawings. The same reference numerals are used to denote the same elements in the drawings, and repeated descriptions thereof are omitted. It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept. As used herein, the term "and/or" includes any and all combinations of one or more of the associated listed items. It is noted that aspects described with respect to one embodiment may be incorporated in different embodiments although not specifically described relative thereto. That is, all embodiments and/or features of any embodiments can be combined in any way and/or combination.

Figure 1:
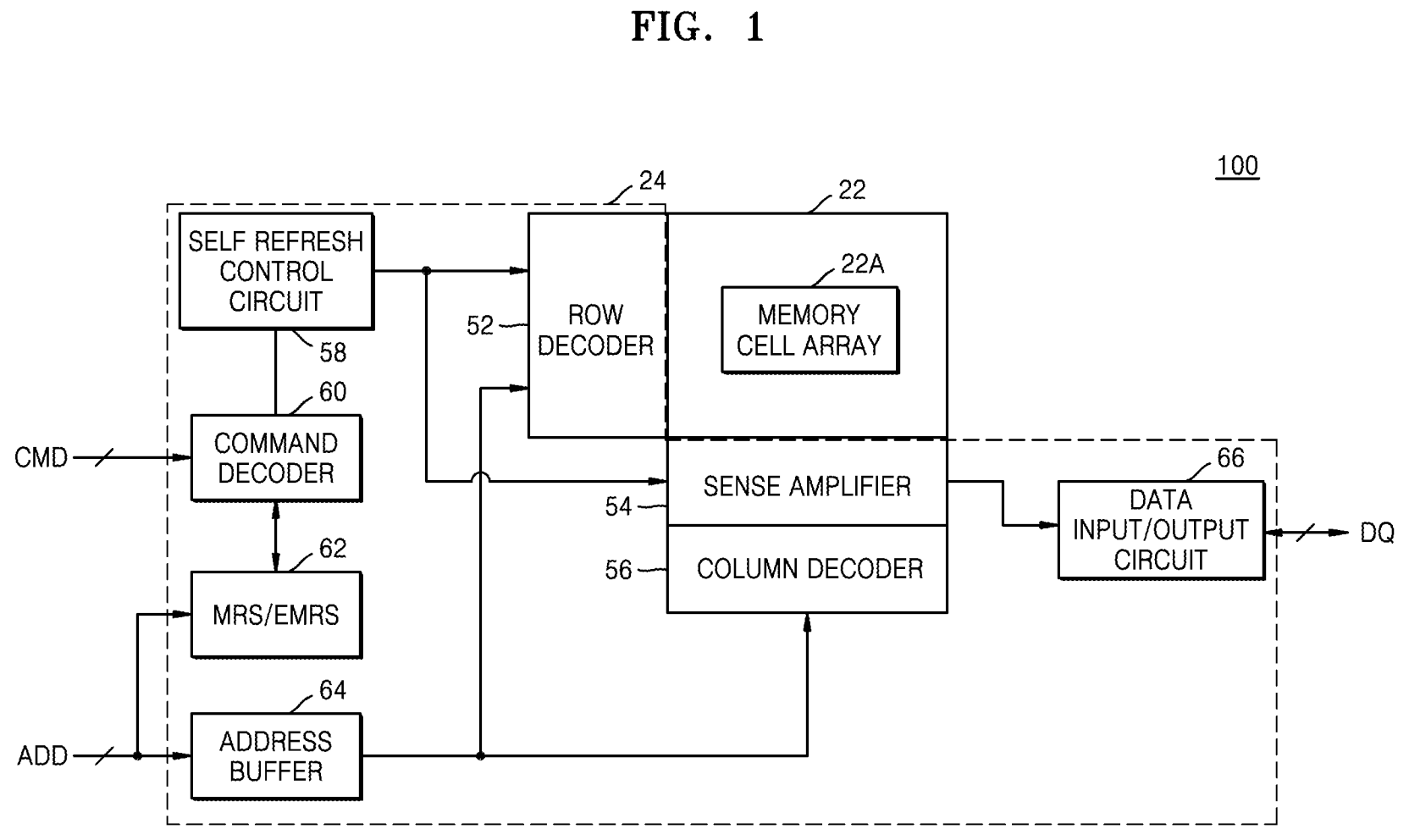

FIG. 1 is a block diagram of an example configuration of an integrated circuit (IC) device, according to embodiments.

Referring to FIG. 1, the IC device 100 may include a first region 22 and a second region 24. The first region 22 may be a memory cell region of a dynamic random access memory (DRAM) device, and the second region 24 may be a peripheral circuit region of the DRAM device. The first region 22 may include a memory cell array 22A. The second region 24 may include a row decoder 52, a sense amplifier 54, a column decoder 56, a self-refresh control circuit 58, a command decoder 60, a mode register set/extended mode register set (MRS/EMRS) circuit 62, an address buffer 64, and a data input/output (I/O) circuit 66.

FIG. 2 is a plan view of an example arrangement of the IC device 100 shown in FIG. 1.

Referring to FIG. 2, the IC device 100 may include a plurality of first regions 22. Each of the plurality of first regions 22 may be surrounded or bordered by the second region 24. It will be understood that the borders or boundaries described herein may not be physical structures, but rather, represent respective peripheries of an element described herein. Thus, the term "boundary" and "border" may be used interchangeably herein.

Each of the plurality of first regions 22 may be a cell array region MCA of a DRAM device, and the second region 24 may be a region (hereinafter, referred to as a "peripheral circuit region") including a region in which peripheral circuits of the DRAM device are formed and a core region. In the plurality of first regions 22, the cell array region MCA may include the memory cell array 22A described with reference to FIG. 1.

The second region 24 may include a sub-word line driver block SWD, a sense amplifier block S/A, and a conjunction block CJT. A plurality of bit line sense amplifiers may be in the sense amplifier block S/A. The conjunction block CJT may be at an intersection between the sub-word line driver block SWD and the sense amplifier block S/A. Power drivers and ground drivers for driving the bit line sense amplifiers may be alternately arranged in the conjunction block CJT. Peripheral circuits, such as an inverter chain and an I/O circuit, may be further formed in the second region 24.

Figure 3:
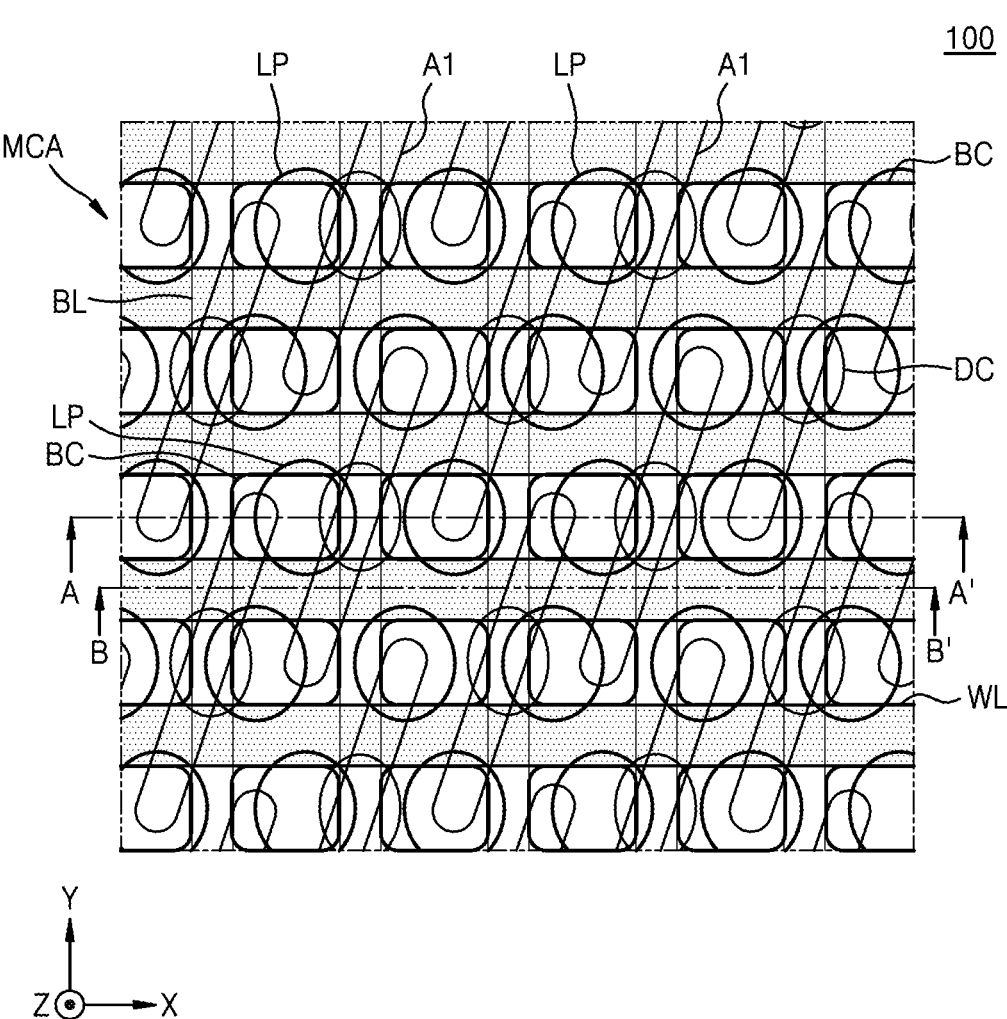
FIG. 3 is a plan layout diagram of main components of a cell array region of an IC device according to embodiments.

FIG. 3 is a plan layout diagram of main components of the cell array region MCA shown in FIG. 2.

Referring to FIG. 3, the cell array region MCA may include a plurality of cell active regions A1. Each of the plurality of cell active regions A1 may be arranged to have a major axis in an oblique direction with respect to each of a first lateral direction (X direction) and a second lateral direction (Y direction). The plurality of word lines WL may intersect with the plurality of cell active regions A1 and extend parallel to each other in the first lateral direction (X direction). A plurality of bit lines BL may extend parallel to each other in the second lateral direction (Y direction) on the plurality of word lines WL. The plurality of bit lines BL may be connected to the plurality of cell active regions A1 through direct contacts DC. A plurality of buried contacts BC may be formed between two adjacent ones of the plurality of bit lines BL. The plurality of buried contacts BC may be arranged in a line in each of the first lateral direction (X direction) and the second lateral direction (Y direction). A plurality of conductive landing pads LP may be formed on the plurality of buried contacts BC. The plurality of buried contacts BC and the plurality of conductive landing pads LP may connect a lower electrode (not shown) of a capacitor formed on the plurality of bit lines BL to the cell active region A1. Each of the plurality of conductive landing pads LP may partially overlap the buried contact BC in the vertical direction (Z direction).

The plurality of conductive landing pads LP shown in FIG. 3 may be formed through a series of processes including a plurality of exposure processes. In embodiments, the series of processes for forming the plurality of conductive landing pads LP may include a photolithography process using extreme ultraviolet (EUV).

Figure 4A:
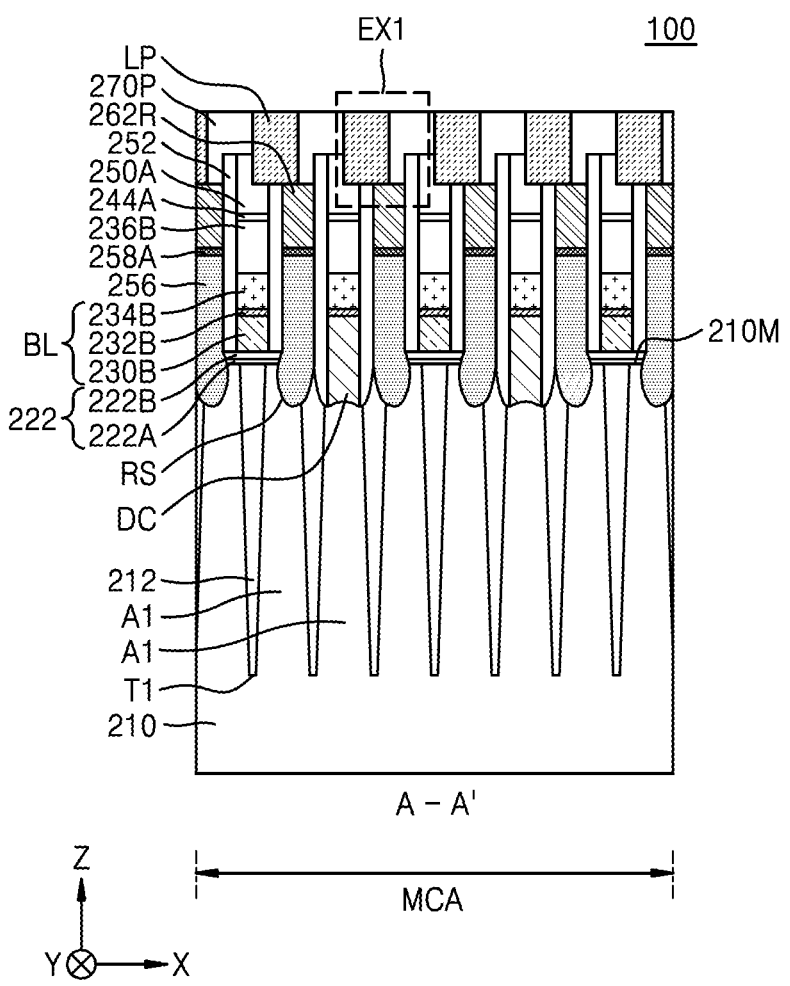
FIGS. 4A and 4B are cross-sectional views of an example configuration of a cell array region of an IC device according to embodiments.
Figure 4B:
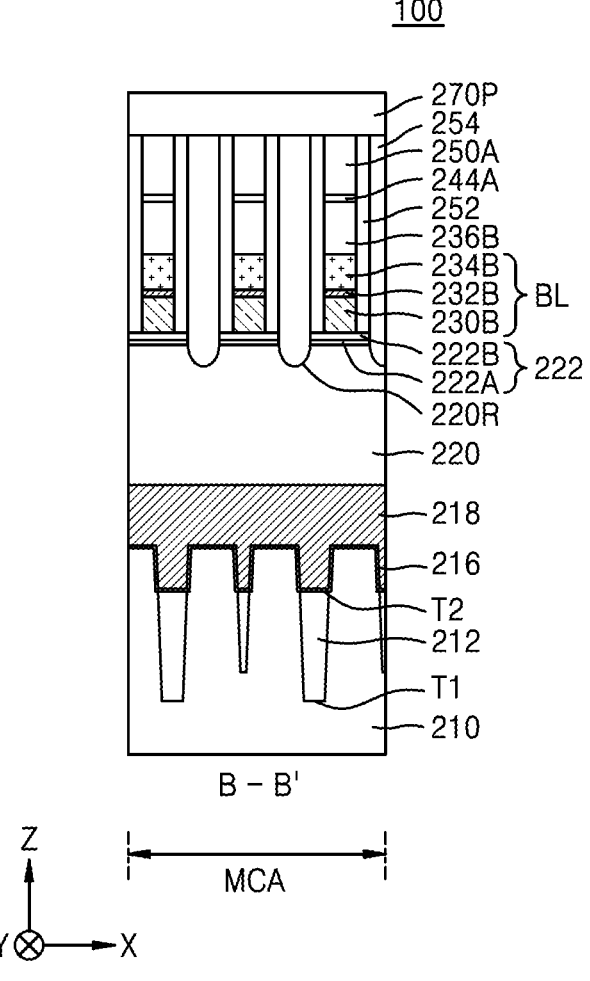
Figure 5:
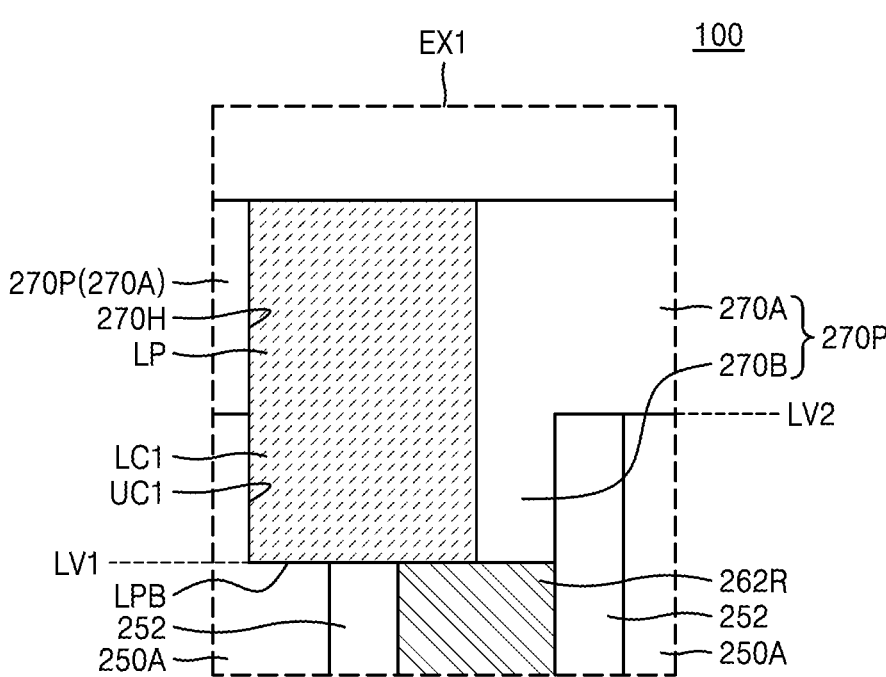
FIG. 5 is an enlarged cross-sectional view of region "EX1" of FIG. 4A.

FIGS. 4A and 4B are cross-sectional views of an example configuration of a cell array region MCA of an IC device 100 according to embodiments. FIG. 4A illustrates a cross-sectional configuration of a partial region according to a cross-section taken along line A-A' of FIG. 3, and FIG. 4B illustrates a cross-sectional configuration of a partial region corresponding to a cross-section taken along line B—B' of FIG. 3. FIG. 5 is an enlarged cross-sectional view of region "EX1" of FIG. 4A.

Referring to FIGS. 4A, 4B, and 5, the IC device 100 may include a substrate 210 having a cell array region MCA. A device isolation trench T1 may be formed in the substrate 210, and a device isolation film 212 may be formed inside the device isolation trench T1. In the cell array region MCA, a plurality of cell active regions A1 may be defined by the device isolation film 212 in the substrate 210.

The substrate 210 may include silicon, for example, monocrystalline silicon, polycrystalline silicon, or amorphous silicon. In some embodiments, the substrate 210 may include germanium (Ge), silicon germanium (SiGe), silicon carbide (SiC), gallium arsenide (GaAs), indium arsenide (InAs), and/or indium phosphide (InP). In some embodiments, the substrate 210 may include a conductive region, for example, a doped well or a doped structure. The device isolation film 212 may include an oxide film, a nitride film, or a combination thereof.

As shown in FIG. 4B, in the cell array region MCA, a plurality of word line trenches T2 extending in a first lateral direction (X direction) may be formed in the substrate 210, and a plurality of gate dielectric films 216, a plurality of word lines 218, and a plurality of buried insulating films 220 may be formed in the plurality of word line trenches T2. The plurality of word lines 218 may correspond to the plurality of word lines WL shown in FIG. 3. A plurality of recesses 220R may be formed in a top surface of the buried insulating film 220.

Each of the plurality of gate dielectric films 216 may include a silicon oxide film, a silicon nitride film, a silicon oxynitride film, an oxide/nitride/oxide (ONO) film, and/or a high-k dielectric film having a higher dielectric constant than the silicon oxide film. For example, the plurality of gate dielectric films 216 may include $HfO_2$, $Al_2O_3$, $HfAlO_3$, $Ta_2O_3$, and/or $TiO_2$, without being limited thereto. The plurality of word lines 218 may include titanium (Ti), titanium nitride (TiN), tantalum (Ta), tantalum nitride (TaN), tungsten (W), tungsten nitride (WN), titanium silicon nitride (TiSiN), tungsten silicon nitride (WSiN), or a combination thereof, without being limited thereto. Each of the plurality of buried insulating films 220 may include a silicon oxide film, a silicon nitride film, a silicon oxynitride film, or a combination thereof, without being limited thereto.

A buffer film 222 may be formed on a main surface 210M of the substrate 210. The buffer film 222 may include a first insulating film 222A and a second insulating film 222B. Each of the first insulating film 222A and the second insulating film 222B may include an oxide film, a nitride film, or a combination thereof. A plurality of direct contacts DC may be on the substrate 210. The plurality of direct contacts DC may be respectively connected to the plurality of cell active regions A1. The plurality of direct contacts DC may include silicon (Si), germanium (Ge), tungsten (W), tungsten nitride (WN), cobalt (Co), nickel (Ni), aluminum (Al), molybdenum (Mo), ruthenium (Ru), titanium (Ti), titanium nitride (TiN), tantalum (Ta), tantalum nitride (TaN), copper (Cu), or a combination thereof, without being limited thereto.

The plurality of bit lines BL may extend lengthwise in the second lateral direction (Y direction) on the substrate 210 and the plurality of direct contacts DC. Each of the plurality of bit lines BL may be connected to the cell active region AC1 through the direct contact DC. Each of the plurality of bit lines BL may include a lower conductive pattern 230B, a middle conductive pattern 232B, and an upper conductive pattern 234B, which are sequentially stacked on the substrate 210.

The lower conductive pattern 230B may include doped polysilicon. Each of the middle conductive pattern 232B and the upper conductive pattern 234B may include TiN, TiSiN, W, tungsten silicide, or a combination thereof. In embodiments, the middle conductive pattern 232B may include TiN, TiSiN, or a combination thereof, and the upper conductive pattern 234B may include W. A lower insulating capping pattern 236B, an insulating thin film pattern 244A, and an upper insulating capping pattern 250A may be on each of the plurality of bit lines BL to sequentially at least partially cover top surfaces of the bit lines BL. As used herein, the lower insulating capping pattern 236B, the insulating thin film pattern 244A, and the upper insulating capping pattern 250A may be referred to as an insulating capping pattern. Each of the lower insulating capping pattern 236B, the insulating thin film pattern 244A, and the upper insulating capping pattern 250A may include a silicon nitride film.

Sidewalls of each of the plurality of bit lines BL and sidewalls of the insulating capping pattern including the lower insulating capping pattern 236B, the insulating thin film pattern 244A, and the upper insulating capping pattern 250A may be at least partially covered by a plurality of insulating spacers 252. The plurality of insulating spacers 252 may extend lengthwise in the second lateral direction (Y direction) parallel to the plurality of bit lines BL. The plurality of insulating spacers 252 may include an oxide film, a nitride film, air spacers, or a combination thereof. As used herein, the term "air" may refer to a space including other gases that may be in the atmosphere or during a manufacturing process. The bit line BL, the lower insulating capping pattern 236B, the insulating thin film pattern 244A, and the insulating capping pattern 250A and a pair of insulating spacers 252 at least partially covering both sidewalls of each thereof may constitute a bit line structure.

A plurality of lower contact plugs 256 and a plurality of insulating fences 254 may be respectively arranged in a line in the second lateral direction (Y direction) between the plurality of bit lines BL. The plurality of lower contact plugs 256 may extend lengthwise in a vertical direction (Z direction) from a recess space RS formed in the substrate 210. Each of the plurality of lower contact plugs 256 may be electrically connected to a selected one of the plurality of cell active regions A1. The plurality of insulating fences 254 may be in and at least partially fill the plurality of recesses 220R formed in the top surface of the buried insulating film 220 and be respectively arranged one-by-one between the plurality of lower contact plugs 256. In the second lateral direction (Y direction), both sidewalls of each of the plurality of lower contact plugs 256 may be at least partially covered by the plurality of insulating fences 254. The plurality of lower contact plugs 256 arranged in a line in the second lateral direction (Y direction) may be insulated from each other by the plurality of insulating fences 254. The plurality of lower contact plugs 256 may constitute the plurality of buried contacts BC shown in FIG. 3. Each of the plurality of lower contact plugs 256 may be apart from the bit line BL in the first lateral direction (X direction) with the insulating spacer 252 therebetween. The plurality of lower contact plugs 256 may include doped polysilicon. The plurality of insulating fences 254 may include a silicon nitride film.

A plurality of metal silicide films 258A, a plurality of recess contact plugs 262R, and a plurality of conductive landing pads LP may be sequentially formed on the plurality of lower contact plugs 256. Each of the plurality of metal silicide films 258A, the plurality of recess contact plugs 262R, and the plurality of conductive landing pads LP may overlap the lower contact plug 256 in the vertical direction (Z direction). In embodiments, the plurality of metal silicide films 258A may be omitted. The plurality of metal silicide films 258A may include cobalt silicide, nickel silicide, and/or manganese silicide.

Each of the plurality of recess contact plugs 262R may be connected to the lower contact plug 256 through the metal silicide film 258A. Each of the plurality of conductive landing pads LP may be electrically connected to the recess contact plug 262R and be electrically connected to the lower contact plug 256 through the recess contact plug 262R and the metal silicide film 258A. Each of the plurality of recess contact plugs 262R may be apart from the lower insulating capping pattern 236B, the insulating thin film pattern 244A, and the upper insulating capping pattern 250A in the first lateral direction (X direction) with the insulating spacer 252 therebetween.

The plurality of recess contact plugs 262R and the plurality of conductive landing pads LP may each include a metal, a conductive metal nitride, or a combination thereof. In embodiments, each of the plurality of recess contact plugs 262R and the plurality of conductive landing pads LP may include TiN, W, or a combination thereof. In an example, at least some of the plurality of recess contact plugs 262R and the plurality of conductive landing pads LP may include only a TiN film. In another example, at least some of the plurality of recess contact plugs 262R and the plurality of conductive landing pads LP may include a stack structure of a TiN barrier film and a W film.

In embodiments, the plurality of recess contact plugs 262R and the plurality of conductive landing pads LP may include the same metal as each other. In other embodiments, the plurality of recess contact plugs 262R and the plurality of conductive landing pads LP may include different one or more metals from each other. In an example, each of the plurality of recess contact plugs 262R and the plurality of conductive landing pads LP may include only a TiN film. In another example, each of the plurality of recess contact plugs 262R and the plurality of conductive landing pads LP may include a stack structure of a TiN barrier film and a W film. In still another example, each of the plurality of recess contact plugs 262R may include only a TiN film, and each of the plurality of conductive landing pads LP may include a stack structure of a TiN barrier film and a W film. In still another example, each of the plurality of recess contact plugs 262R may include a stack structure of a TiN barrier film and a W film, and each of the plurality of conductive landing pads LP may include only a TiN film.

As shown in FIG. 5, the upper insulating capping pattern 250A included in the bit line structure may have an upper cutout portion UC1 apart from the bit line BL in the vertical direction (Z direction). The upper cutout portion UC1 of the upper insulating capping pattern 250A may be the resultant structure obtained by removing a portion of only one of both upper corner portions of the upper insulating capping pattern 250A. A top surface of the insulating spacer 252 adjacent to the upper cutout portion UC1 of the upper insulating capping pattern 250A may extend on the same plane as a partial surface of the upper cutout portion UC1 of the upper insulating capping pattern 250A.

As shown in FIGS. 4A and 5, an engraved insulating pattern 270P may be on the plurality of upper insulating capping patterns 250A, the plurality of insulating spacers 252, and the plurality of recess contact plugs 262R. The engraved insulating pattern 270P may include a first portion 270A and a second portion 270B. The first portion 270A may be in contact with a top surface of a region of the upper insulating capping pattern 250A, except for the upper cutout portion UC1. The second portion 270B may at least partially cover a portion of a top surface of the recess contact plug 262R. In the engraved insulating pattern 270P, a vertical level LV1 of a lowermost surface of the second portion 270B may be closer to the substrate 210 than a vertical level LV2 of a lowermost surface of the first portion 270A. As used herein, the term "vertical level" may refer to a distance from the main surface 210M of the substrate 210 in the vertical direction (Z direction or –Z direction).

The engraved insulating pattern 270P may have a plurality of openings 270H, which pass through the engraved insulating pattern 270P in the vertical direction (Z direction). Each of the plurality of openings 270H may be defined by the first portion 270A and the second portion 270B of the engraved insulating pattern 270P.

Each of the plurality of conductive landing pads LP may include a lower corner portion LC1, which at least partially fills a portion of the opening 270H of the engraved insulating pattern 270P and contacts the upper cutout portion UC1 of the upper insulating capping pattern 250A. In addition, each of the plurality of conductive landing pads LP may have a surface in contact with a portion of the top surface of the recess contact plug 262R.

The vertical level LV1 of a lowermost surface of each of the plurality of conductive landing pads LP may be closer to the substrate 210 than the vertical level LV2 of an uppermost surface of each of a plurality of bit line structures (i.e., an uppermost surface of the upper insulating capping pattern 250A).

As shown in FIGS. 4A and 5, in a portion adjacent to an interface between the engraved insulating pattern 270P and the upper insulating capping pattern 250A, a sidewall of the first portion 270A of the engraved insulating pattern 270P and the upper cutout portion UC1 of the upper insulating capping pattern 250A may extend in a gentle line without curves. For example, in the portion adjacent to the interface between the engraved insulating pattern 270P and the upper insulating capping pattern 250A, the sidewall of the first portion 270A of the engraved insulating pattern 270P and the upper cutout portion UC1 of the upper insulating capping pattern 250A may extend in a straight line. Each of the plurality of conductive landing pads LP may be in contact with the sidewall of the first portion 270A of the engraved insulating pattern 270P and the upper cutout portion UC1 of the upper insulating capping pattern 250A in the portion adjacent to the interface between the engraved insulating pattern 270P and the upper insulating capping pattern 250A.

The lower corner portion LC1 of each of the plurality of conductive landing pads LP may have a convex shape toward the upper cutout portion UC1 of the upper insulating capping pattern 250A, and the upper cutout portion UC1 of the upper insulating capping pattern 250A may have a shape corresponding to the lower corner portion LC1 and have a convex shape toward the lower corner portion LC1. In embodiments, a bottom surface of the conductive landing pad LP may be at the same vertical level LV1 as the top surface of the recess contact plug 262R. A vertical distance from the bottom surface of the conductive landing pad LP to the main surface 210M of the substrate 210 may be substantially equal to a vertical distance from the top surface of the recess contact plug 262R to the main surface 210M of the substrate 210.

Each of the plurality of conductive landing pads LP may at least partially cover the upper cutout portion UC1 of the upper insulating capping pattern 250A and overlap a portion of the bit line BL in the vertical direction (Z direction). In a view from above, the plurality of conductive landing pads LP may have a plurality of island-type pattern shapes. The plurality of conductive landing pads LP may be electrically insulated from each other by the engraved insulating pattern 270P. The engraved insulating pattern 270P may include a silicon nitride film, without being limited thereto.

A plurality of capacitors may be formed on the plurality of conductive landing pads LP.

Figure 6:
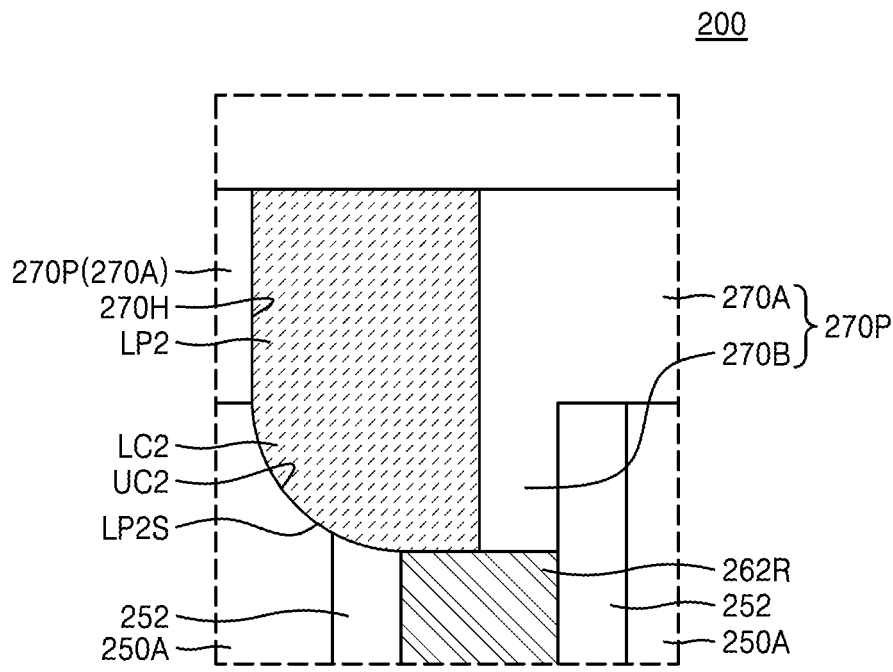
FIG. 6 is a cross-sectional view of an IC device according to embodiments.

FIG. 6 is a cross-sectional view of an IC device 200 according to embodiments. FIG. 6 illustrates an enlarged cross-sectional configuration of a portion of the IC device 200, which corresponds to region "EX1" of FIG. 4A. In FIG. 6, the same reference numerals are used to denote the same elements as in FIGS. 4A, 4B, and 5, and repeated descriptions thereof are omitted.

Referring to FIG. 6, the IC device 200 may substantially have the same configuration as the IC device 100 described with reference to FIGS. 4A, 4B, and 5. However, the IC device 200 may include a conductive landing pad LP2 at least partially filling an opening 270H of an engraved insulating pattern 270P.

The conductive landing pad LP2 may substantially have the same configuration as the conductive landing pad LP described with reference to FIGS. 4A and 5. However, the conductive landing pad LP2 may have a round surface LP2S, which is in contact with each of an upper insulating capping pattern 250A and an insulating spacer 252, which constitute a portion of an insulating capping structure.

The upper insulating capping pattern 250A may have an upper round cutout portion UC2 apart from the bit line BL in a vertical direction (Z direction). The upper round cutout portion UC2 of the upper insulating capping pattern 250A may be the resultant structure obtained by removing a portion of only one of both upper corner portions of the upper insulating capping pattern 250A.

The conductive landing pad LP2 may include a lower round corner portion LC2, which at least partially fills a portion of the opening 270H of the engraved insulating pattern 270P and contacts the upper round cutout portion UC2 of the upper insulating capping pattern 250A. The lower round corner portion LC2 of the conductive landing pad LP2 may have a convex round shape toward the upper round cutout portion UC2 of the upper insulating capping pattern 250A, and the upper round cutout portion UC2 of the upper insulating capping pattern 250A may have a shape corresponding to the lower round corner portion LC2 of the conductive landing pad LP2 and have a concave round shape toward the lower round corner portion LC2.

In a portion adjacent to an interface between the engraved insulating pattern 270P and the upper insulating capping pattern 250A, a sidewall of the first portion 270A of the engraved insulating pattern 270P and the upper round cutout portion UC2 of the upper insulating capping pattern 250A may extend in a gentle line. The conductive landing pad LP2 may be in contact with the sidewall of the first portion 270A of the engraved insulating pattern 270P and the upper round cutout portion UC2 of the upper insulating capping pattern 250A in the portion adjacent to the interface between the engraved insulating pattern 270P and the upper insulating capping pattern 250A.

Figure 7:
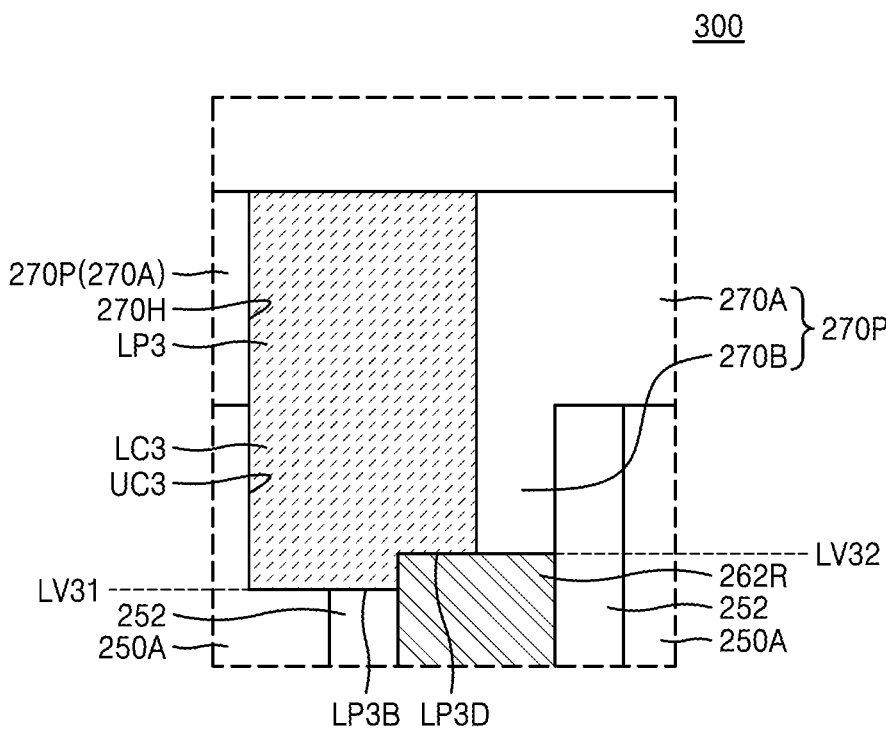
FIG. 7 is a cross-sectional view of an IC device according to embodiments.

FIG. 7 is a cross-sectional view of an IC device 300 according to embodiments. FIG. 7 illustrates an enlarged cross-sectional configuration of a portion of the IC device 300, which corresponds to region "EX1" of FIG. 4A. In FIG. 7, the same reference numerals are used to denote the same elements as in FIGS. 4A, 4B, and 5, and repeated descriptions thereof are omitted.

Referring to FIG. 7, the IC device 300 may substantially have the same configuration as the IC device 100 described with reference to FIGS. 4A, 4B, and 5. However, the IC device 300 may include a conductive landing pad LP3 at least partially filling an opening 270H of an engraved insulating pattern 270P.

The conductive landing pad LP3 may substantially have the same configuration as the conductive landing pad LP described with reference to FIGS. 4A and 5. However, a vertical level LV31 of a lowermost surface of each of the conductive landing pads LP3 may be closer to the substrate 210 than a vertical level LV32 of an uppermost surface of a recess contact plug 262R. A vertical distance from the lowermost surface of the conductive landing pad LP3 to a main surface (refer to 210M in FIG. 4A) of the substrate 210 may be less than a vertical distance from the uppermost surface of the recess contact plug 262R to the main surface 210M of the substrate 210. The conductive landing pad LP3 may include a pad dent portion LP3D surrounding or bordering an upper corner portion of the recess contact plug 262R. The pad dent portion LP3D of the conductive landing pad LP3 may have a concave shape toward the upper corner portion of the recess contact plug 262R. The pad dent portion LP3D of the conductive landing pad LP3 may at least partially cover a top surface of the recess contact plug 262R and a sidewall of the recess contact plug 262R, which faces the upper insulating capping pattern 250A.

The upper insulating capping pattern 250A may have an upper cutout portion UC3 apart from the bit line BL in a vertical direction (Z direction). The upper cutout portion UC3 of the upper insulating capping pattern 250A may be the resultant structure obtained by removing a portion of only one of both upper corner portions of the upper insulating capping pattern 250A.

The conductive landing pad LP3 may include a lower corner portion LC3, which at least partially fills a portion of the opening 270H of the engraved insulating pattern 270P and contacts the upper cutout portion UC3 of the upper insulating capping pattern 250A. The lower corner portion LC3 of the conductive landing pad LP3 may have a convex shape toward the upper cutout portion UC3 of the upper insulating capping pattern 250A, and the upper cutout portion UC3 of the upper insulating capping pattern 250A may have a shape corresponding to the lower corner portion LC3 of the conductive landing pad LP3 and have a concave shape toward the lower corner portion LC3.

Figure 8:
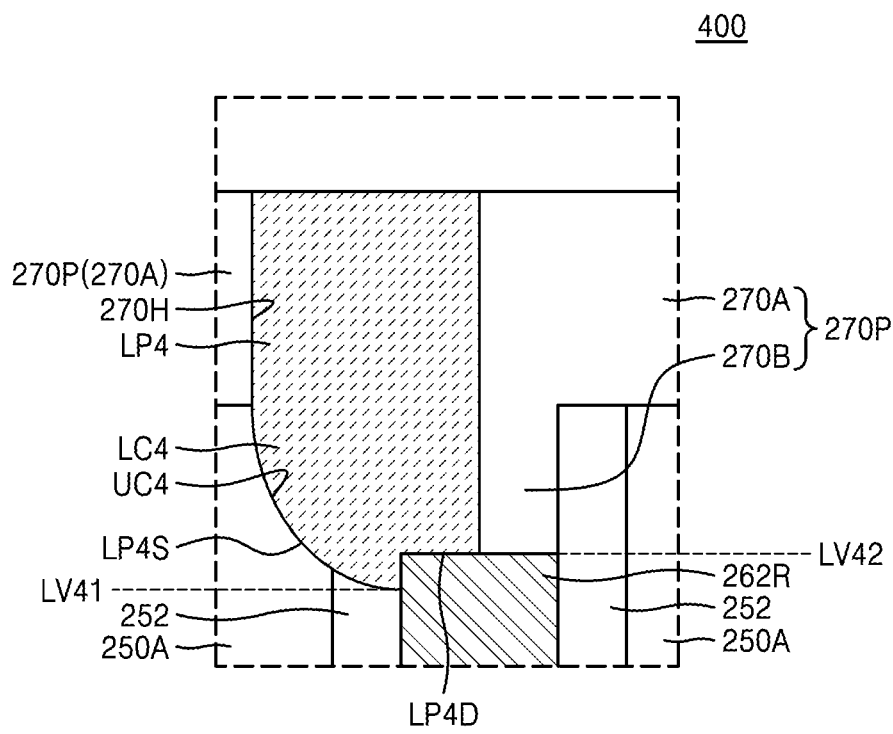
FIG. 8 is a cross-sectional view of an IC device according to embodiments.

FIG. 8 is a cross-sectional view of an IC device 400 according to embodiments. FIG. 8 illustrates an enlarged cross-sectional configuration of a portion of the IC device 400, which corresponds to region "EX1" of FIG. 4A. In FIG. 8, the same reference numerals are used to denote the same elements as in FIGS. 4A, 4B, and 5, and repeated descriptions thereof are omitted.

Referring to FIG. 8, the IC device 400 may substantially have the same configuration as the IC device 300 described with reference to FIG. 7. However, the IC device 400 may include a conductive landing pad LP4 at least partially filling an opening 270H of an engraved insulating pattern 270P.

The conductive landing pad LP4 may substantially have the same configuration as the conductive landing pad LP described with reference to FIGS. 4A and 5. However, the conductive landing pad LP4 may have a round surface LP4S, which is in contact with each of an upper insulating capping pattern 250A and an insulating spacer 252, which constitute a portion of an insulating capping structure.

A vertical level LV41 of a lowermost surface of the conductive landing pad LP4 may be closer to the substrate 210 than a vertical level LV42 of an uppermost surface of a recess contact plug 262R. A vertical distance from the lowermost surface of the conductive landing pad LP4 to the main surface (refer to 210M in FIG. 4A) of the substrate 210 may be less than a vertical distance from the uppermost surface of the recess contact plug 262R to the main surface 210M of the substrate 210. The conductive landing pad LP4 may include a pad dent portion LP4D surrounding or bordering an upper corner portion of the recess contact plug 262R. The pad dent portion LP4D of the conductive landing pad LP4 may have a concave shape toward the upper corner portion of the recess contact plug 262R. The pad dent portion LP4D of the conductive landing pad LP4 may at least partially cover a top surface of the recess contact plug 262R and a sidewall of the recess contact plug 262R, which faces the upper insulating capping pattern 250A.

The upper insulating capping pattern 250A may have an upper round cutout portion UC4 apart from the bit line BL in a vertical direction (Z direction). The upper round cutout portion UC4 of the upper insulating capping pattern 250A may be the resultant structure obtained by removing a portion of only one of both upper corner portions of the upper insulating capping pattern 250A.

The conductive landing pad LP4 may include a lower round corner portion LC4, which at least partially fills a portion of the opening 270H of the engraved insulating pattern 270P and contacts the upper round cutout portion UC4 of the upper insulating capping pattern 250A. The lower round corner portion LC4 of the conductive landing pad LP4 may have a convex round shape toward the upper round cutout portion UC4 of the upper insulating capping pattern 250A, and the upper round cutout portion UC4 of the upper insulating capping pattern 250A may have a shape corresponding to the lower round corner portion LC4 of the conductive landing pad LP4 and have a concave round shape toward the lower round corner portion LC4.

Because the IC devices 100, 200, 300, and 400 according to the inventive concept include a plurality of conductive landing pads (e.g., LP, LP2, LP3, and LP4), which are obtained by using an engraved patterning technique in a device region having a relatively high pattern density, failures may be reduced or prevented. For example, a short circuit may be prevented from occurring between each of the conductive landing pads LP, LP2, LP3, and LP4 and another conductive region adjacent thereto or a partial region of each of the conductive landing pads LP, LP2, LP3, and LP4 may be prevented from becoming thinner than other regions or being cut. In addition, a contact area between each of the plurality of conductive landing pads LP, LP2, LP3, and LP4 and the recess contact plug 262R may be increased to improve electrical reliability. Therefore, the reliability of the IC devices 100, 200, 300, and 400 including the plurality of conductive landing pads LP, LP2, LP3, and LP4 may be improved.

FIGS. 9A to 9L and 10A to 10F are cross-sectional views of process sequences of methods of manufacturing IC devices, according to embodiments. FIGS. 9A to 9L and 10A to 10F illustrate a cross-sectional configuration of a partial region of a portion corresponding to a cross-section taken along line A-A' of FIG. 3, according to a process sequence. In FIGS. 10A to 10F, the illustration of some components shown in FIG. 9L is omitted for brevity. An example method of manufacturing the IC device 100 shown in FIGS. 4A, 4B, and 5 is described with reference to FIGS. 9A to 9L and 10A to 10F.

Figure 9A:
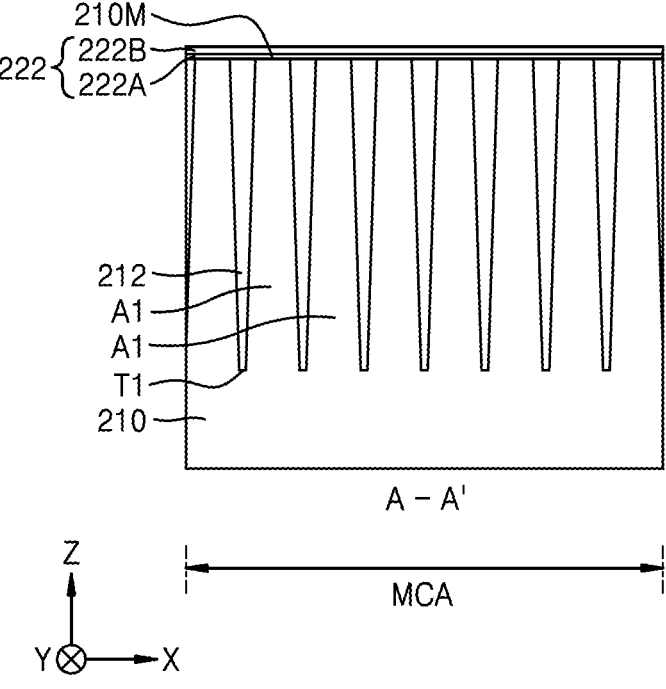
FIGS. 9A to 9L are cross-sectional views of a process sequence of methods of manufacturing an IC device, according to embodiments.

Referring to FIG. 9A, in a cell array region MCA, a plurality of device isolation trenches T1 and a plurality of device isolation films 212 may be formed in a substrate 210, and thus, a plurality of cell active regions A1 may be defined in the cell array region MCA of the substrate 210.

A plurality of word line trenches (refer to T2 in FIG. 4B) may be formed in the substrate 210 and extend parallel to each other. The resultant structure in which the plurality of word line trenches T2 are formed may be cleaned, and a plurality of gate dielectric films 216, a plurality of word lines 218, and a plurality of buried insulating films 220 may be sequentially formed inside the plurality of word line trenches T2. The plurality of word lines 218 may constitute the plurality of word lines WL shown in FIG. 3. Impurity ions may be implanted into portions on both sides of the plurality of word lines 218 in the plurality of cell active regions A1, and thus, a plurality of source/drain regions may be formed in upper portions of the plurality of cell active regions A1. In embodiments, the plurality of source/drain regions may be formed before the plurality of word lines 218 are formed.

A buffer film 222 may be formed on a main surface 210M of the substrate 210 in the cell array region MCA, and a gate dielectric film 224 may be formed on the substrate 210 in a peripheral circuit region CORE/PERI. The buffer film 222 may include a first insulating film 222A and a second insulating film 222B. Each of the first insulating film 222A and the second insulating film 222B may include an oxide film, a nitride film, or a combination thereof.

Figure 9B:
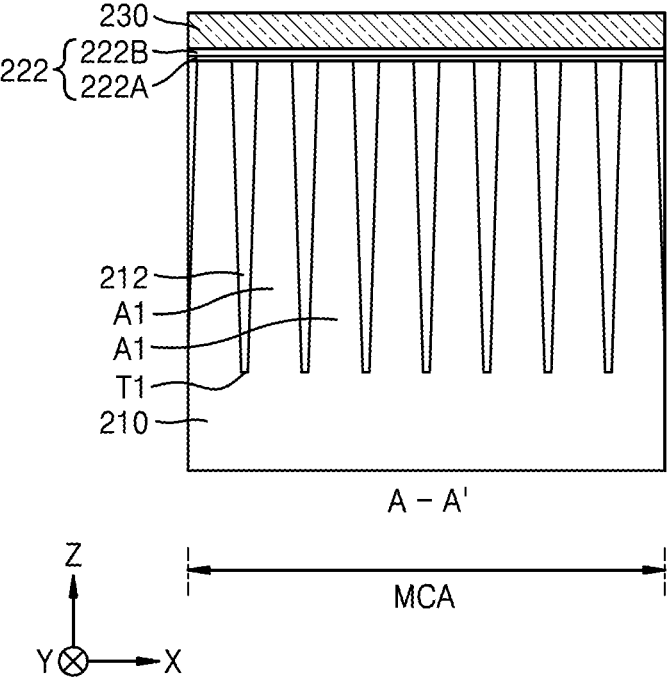

Referring to FIG. 9B, a lower conductive layer 230 may be formed on the buffer film 222. The lower conductive layer 230 may include doped polysilicon.

Figure 9C:
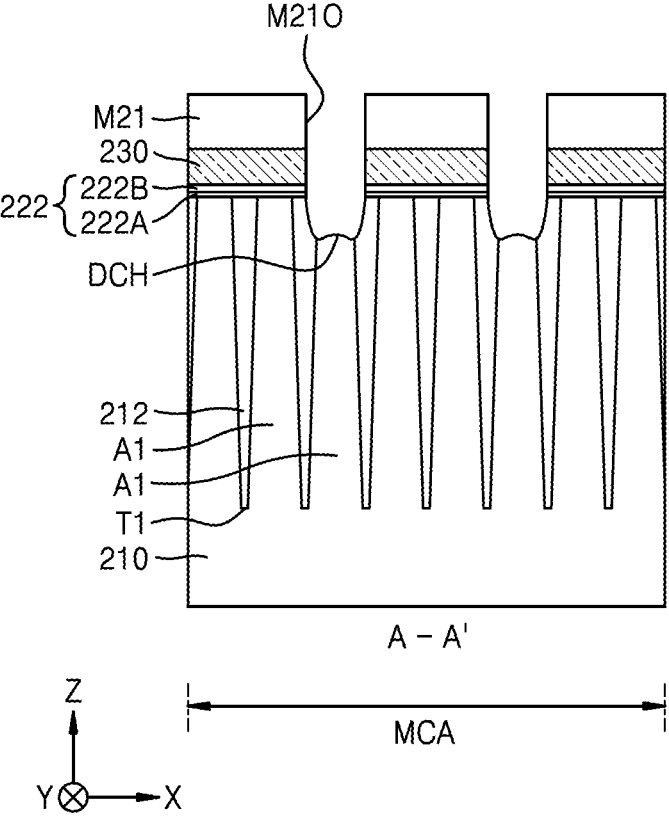

Referring to FIG. 9C, after a mask pattern M21 is formed on the lower conductive layer 230, the lower conductive layer 230 exposed through an opening M210 of the mask pattern M21 may be etched. A portion of the substrate 210 and a portion of the device isolation film 212, which are exposed as a result of the etching, may be etched to form a direct contact hole DCH exposing the cell active region A1 of the substrate 210. The mask pattern M21 may include an oxide film, a nitride film, or a combination thereof.

Figure 9D:
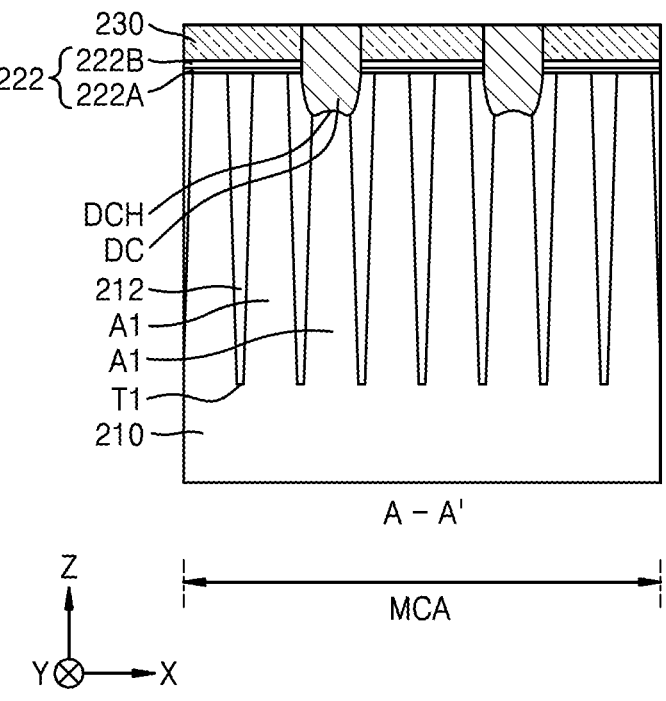

Referring to FIG. 9D, the mask pattern M21 may be removed from the resultant structure of FIG. 9C, and a direct contact DC may be formed inside the direct contact hole DCH. In an example process of forming the direct contact DC, a conductive layer having a sufficient thickness as to at least partially fill the direct contact hole DCH may be formed inside the direct contact hole DCH and on the lower conductive layer 230. Thereafter, the conductive layer may be etched back such that the conductive layer remains only inside the direct contact hole DCH. The conductive layer may include doped polysilicon, Ge, W, WN, Co, Ni, Al, Mo, Ru, Ti, TiN, Ta, TaN, Cu, or a combination thereof.

Figure 9E:
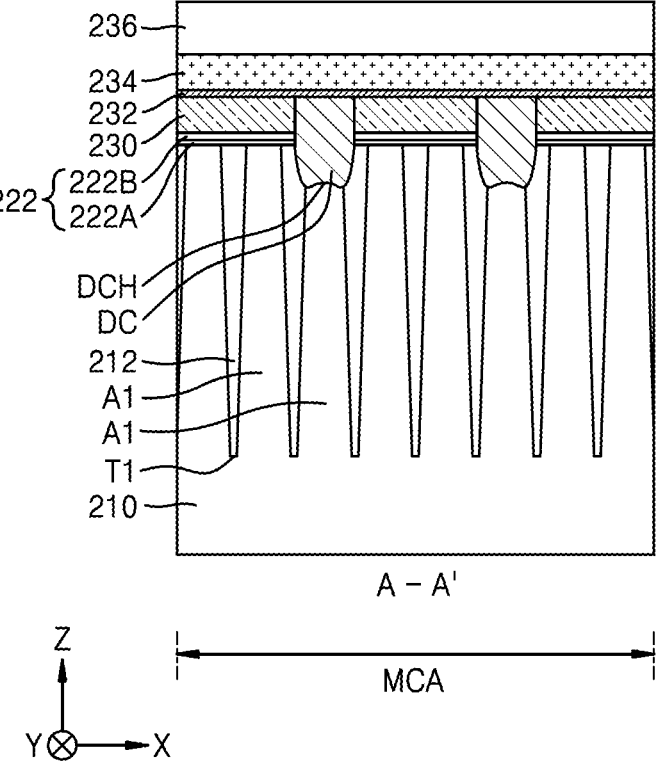

Referring to FIG. 9E, a middle conductive layer 232, an upper conductive layer 234, and a lower insulating capping layer 236 may be sequentially formed on the lower conductive layer 230 and the direct contact DC.

Each of the middle conductive layer 232 and the upper conductive layer 234 may include TiN, TiSiN, W, tungsten silicide, or a combination thereof. In embodiments, the middle conductive layer 232 may include TiN, TiSiN, or a combination thereof, and the upper conductive layer 234 may include W. The lower insulating capping layer 236 may include a silicon nitride film.

Figure 9F:
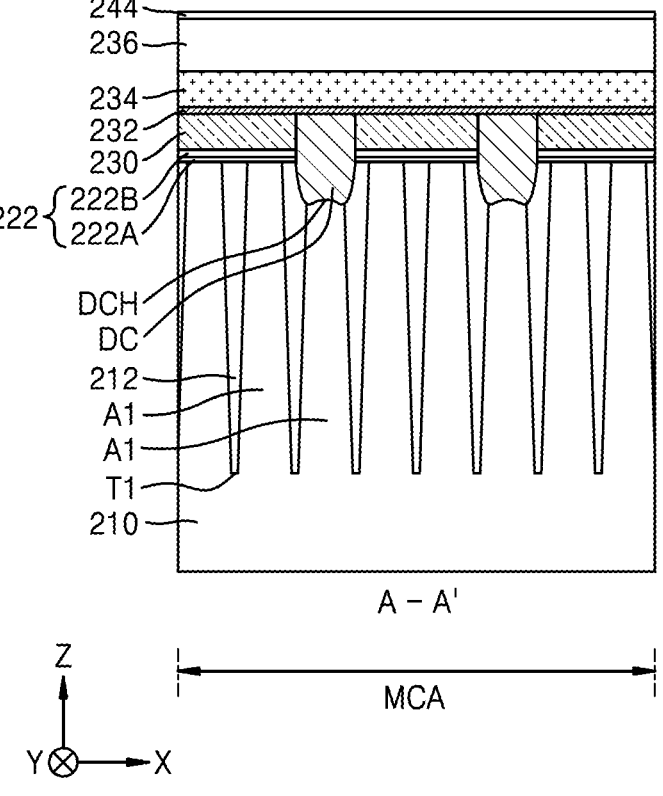

Referring to FIG. 9F, an insulating thin film 244 may be formed on the lower insulating capping layer 236. The insulating thin film 244 may include a silicon nitride film.

Figure 9G:
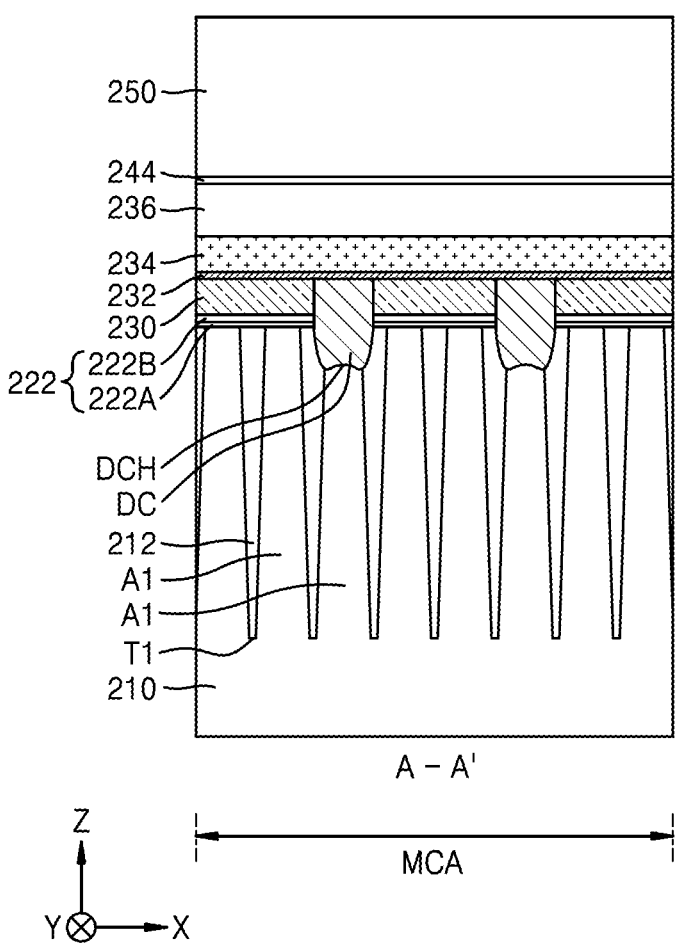

Referring to FIG. 9G, an upper insulating capping layer 250 may be formed on the insulating thin film 244. The upper insulating capping layer 250 may include a silicon nitride film.

Figure 9H:
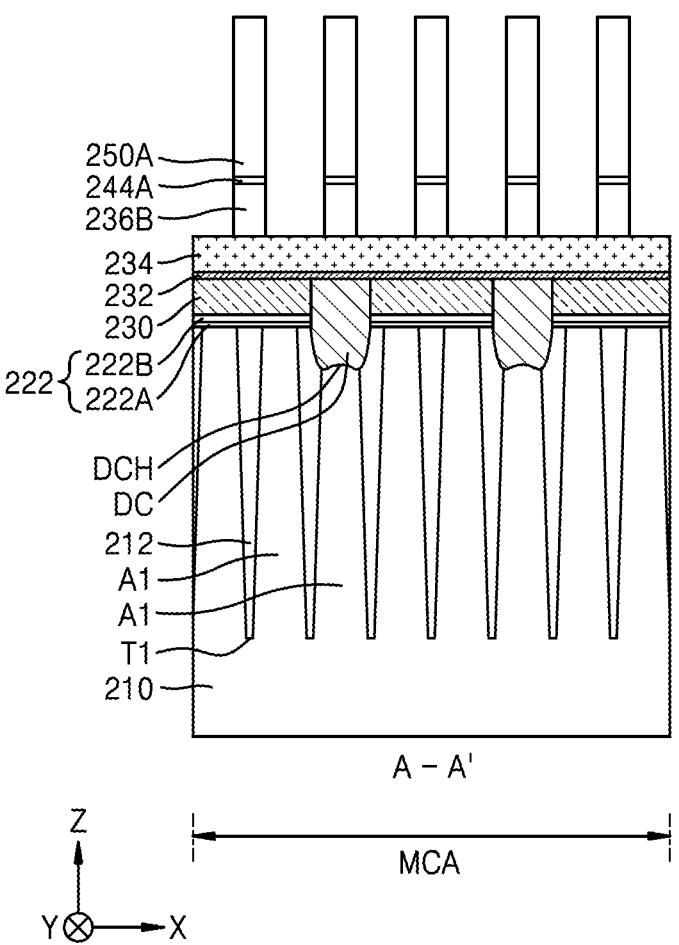

Referring to FIG. 9H, the upper insulating capping layer 250, the insulating thin film 244, and the lower insulating capping layer 236 may be patterned by using a photolithography process, and thus, a lower insulating capping pattern 236B, an insulating thin film pattern 244A, and an upper insulating capping pattern 250A, which are sequentially stacked on the upper conductive layer 234, may be formed.

Figure 9I:
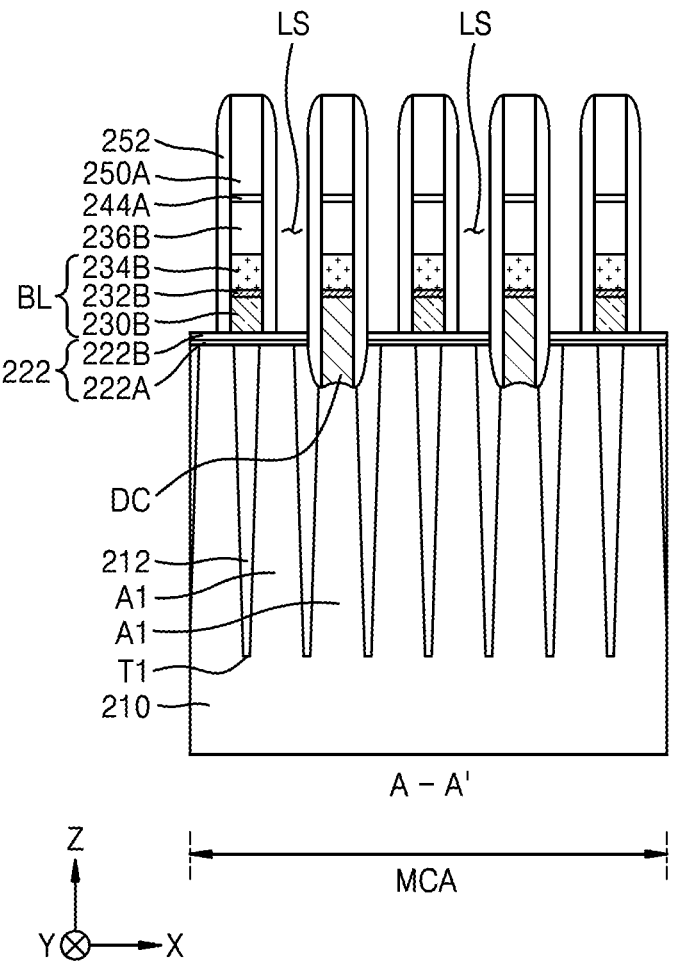

Referring to FIG. 9I, the upper conductive layer 234, the middle conductive layer 232, and the lower conductive layer 230 may be etched by using the lower insulating capping pattern 236B, the insulating thin film pattern 244A, and the upper insulating capping pattern 250A as etch masks. Thus, a plurality of bit lines BL, each of which includes a lower conductive pattern 230B, a middle conductive pattern 232B, and an upper conductive pattern 234B, may be formed.

Afterwards, a plurality of insulating spacers 252 may be formed to at least partially cover both sidewalls of an insulating capping structure including the lower insulating capping pattern 236B, the insulating thin film pattern 244A, and the upper insulating capping pattern 250A and both sidewalls of the bit line BL. The plurality of insulating spacers 252 may be formed around the direct contact DC to at least partially fill the direct contact hole DCH. After the plurality of insulating spacers 252 are formed, a line space LS may remain between the respective bit lines BL. Due to etching processes performed during the formation of the plurality of bit lines BL and the plurality of insulating spacers 252, a height of the upper insulating capping pattern 250A may be reduced.

Figure 9J:
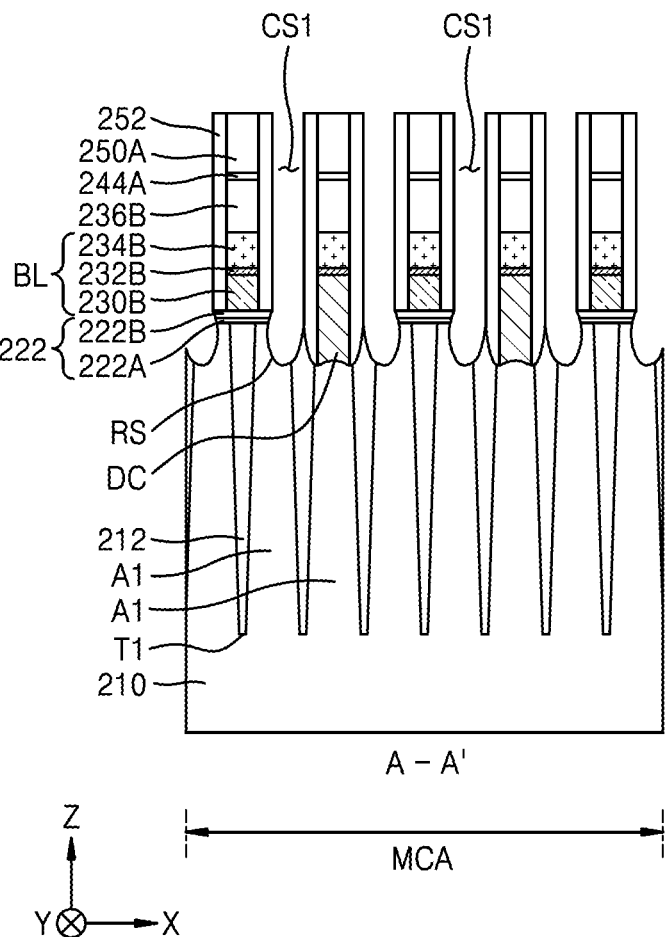

Referring to FIG. 9J, in the cell array region MCA, a plurality of insulating fences (refer to 254 in FIG. 4B) may be formed between the plurality of bit lines BL, respectively, in alternating fashion and thus, the line space LS may be separated into a plurality of contact spaces CS1. Each of the plurality of insulating fences 254 may vertically (Z direction) overlap the word line (refer to 218 in FIG. 4B). One line space LS may be separated by the plurality of insulating fences 254 into a plurality of contact spaces CS1, each of which has a pillar shape. Widths of the plurality of contact spaces CS1 in a lateral direction may be respectively defined by the plurality of insulating spacers 252 and the plurality of insulating fences 254. Because the upper insulating capping pattern 250A and the insulating spacer 252 are exposed to an etching atmosphere that is required during the formation of the plurality of insulating fences 254, the upper insulating capping pattern 250A and the insulating spacer 252 may be partially consumed and have reduced heights.

Thereafter, portions of structures exposed through the plurality of contact spaces CS1 may be removed, and thus, a plurality of recesses RS exposing the cell active region AC of the substrate 210 may be formed between the plurality of bit lines BL, respectively, in alternating fashion.

Figure 9K:
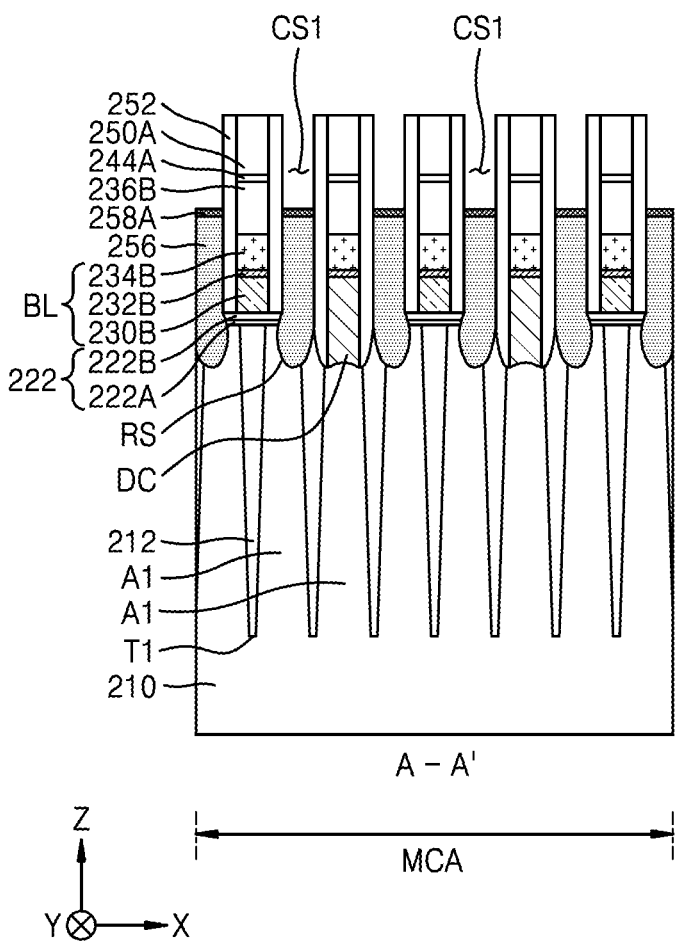
Figure 9L:
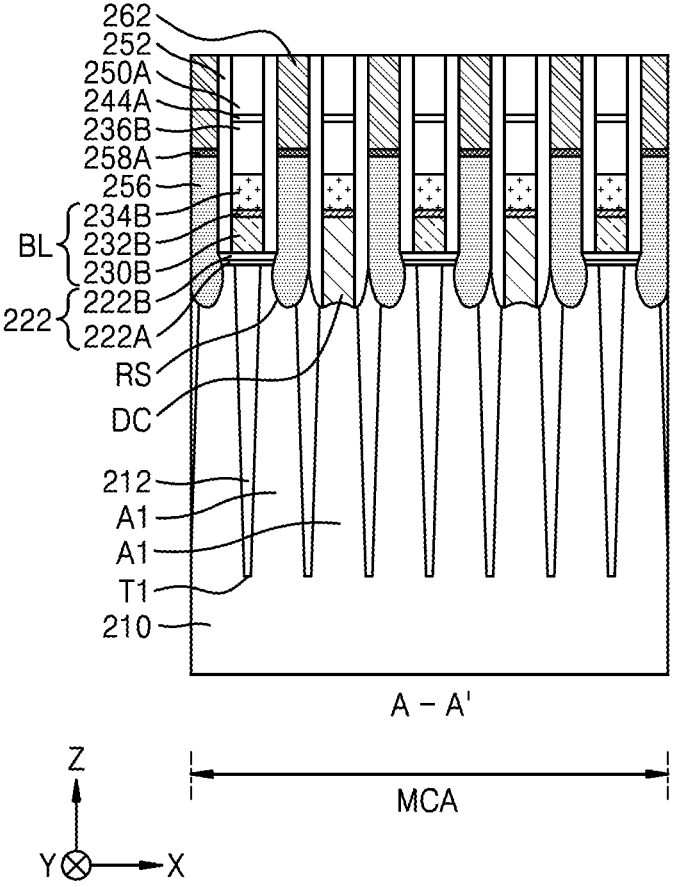

Referring to FIG. 9K, a plurality of lower contact plugs 256 may be formed to respectively at least partially fill the plurality of recesses RS between the plurality of bit lines BL and respectively at least partially fill portions of the contact spaces CS1 between the plurality of bit lines BL. The plurality of lower contact plugs 256 may include doped polysilicon.

A metal silicide film 258A may be formed on each of the plurality of lower contact plugs 256 exposed through the plurality of contact spaces CS1. The metal silicide film 258A may include cobalt silicide, nickel silicide, and/or manganese silicide, without being limited thereto. In embodiments, the process of forming the metal silicide film 258A may be omitted.

Referring to FIG. 9L, in the resultant structure of FIG. 9K, a plurality of upper contact plugs 262 may be formed to at least partially fill the plurality of contact spaces CS1 remaining on a plurality of metal silicide films 258A.

The bit line BL, the lower insulating capping pattern 236B, the insulating thin film pattern 244A, and the upper insulating capping pattern 250A, and a pair of insulating spacers 252 at least partially covering both sidewalls of each of thereof may constitute a bit line structure. The plurality of upper contact plugs 262 may be between a plurality of bit line structures, respectively, in alternating fashion on the substrate 210.

Each of the plurality of upper contact plugs 262 may include a metal, a conductive metal nitride, or a combination thereof. In embodiments, each of the plurality of upper contact plugs 262 may include TiN, W, or a combination thereof. In an example, each of the plurality of upper contact plugs 262 may include only a TiN film. In another example, each of the plurality of upper contact plugs 262 may include a stack structure of a TiN barrier film and a W film.

Respective top surfaces of the plurality of upper contact plugs 262, the plurality of upper insulating capping patterns 250A, and the plurality of insulating spacers 252 may be planarized and extend on the same lateral plane, e.g., Y direction. In embodiments, after the plurality of upper contact plugs 262 are formed, an uppermost surface of the plurality of upper contact plugs 262 and an uppermost surface of each of the upper insulating capping pattern 250A and the insulating spacer 252 of each of the plurality of bit line structures may be at the same vertical level (Z direction).

Figure 10A:
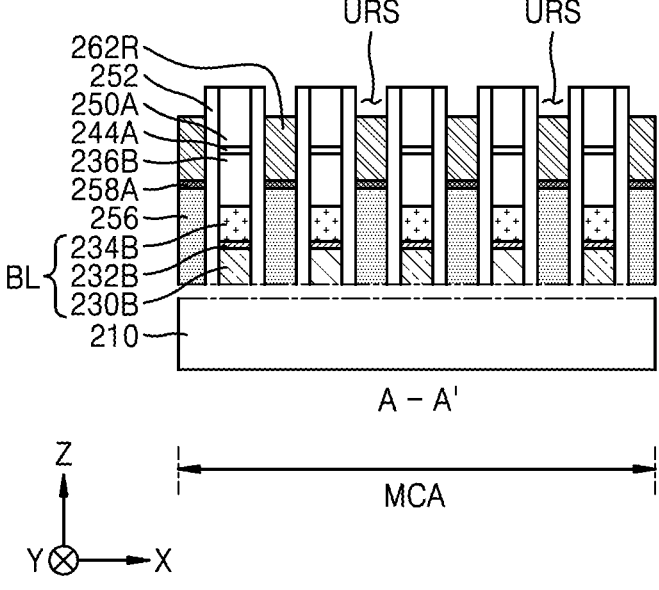
FIGS. 10A to 10F are cross-sectional views of a process sequence of methods of manufacturing an IC device, according to embodiments.

Referring to FIG. 10A, a portion of each of the plurality of upper contact plugs 262 may be removed from the resultant structure of FIG. 9L, and thus, a plurality of recess contact plugs 262R may be formed from the plurality of upper contact plugs 262. As a result, a recess space URS may be formed on the recess contact plug 262R between two adjacent ones of the plurality of upper insulating capping patterns 250A included in the plurality of bit line structures. A vertical level (Z direction) of an uppermost surface of each of the plurality of recess contact plugs 262R may be farther from substrate 210 than a vertical level (Z direction) of an uppermost surface of each of the plurality of bit lines BL.

Figure 10B:
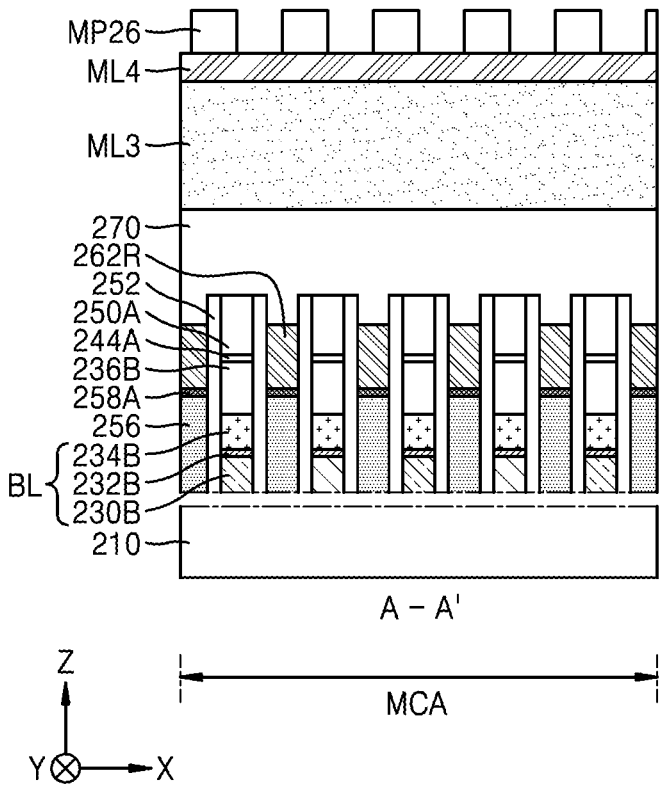

Referring to FIG. 10B, an insulating film 270 may be formed to at least partially cover the resultant structure of FIG. 10A. Thereafter, a lower hard mask layer ML3 and an upper hard mask layer ML4 including different materials from each other may be formed on the insulating film 270, and a photoresist pattern MP26 may be formed on the upper hard mask layer ML4.

In embodiments, the insulating film 270 may include a silicon nitride film, without being limited thereto. The lower hard mask layer ML3 may include a spin on hardmask (SOH) film, and the upper hard mask layer ML4 may include a silicon oxynitride (SiON) film, without being limited thereto. The SOH film may be a film including a hydrocarbon compound having a relatively high carbon content of about 85% to about 99% by weight or a derivative thereof.

The photoresist pattern MP26 may be formed from a resist film for EUV (13.5 nm), a resist film for krypton fluoride (KrF) excimer laser (248 nm), a resist film for argon fluoride (ArF) excimer laser (193 nm), and/or a resist film for fluorine (F$_2$) excimer laser (157 nm). In embodiments, the photoresist pattern MP26 may be formed from a resist film for EUV. For example, the resist film for EUV may be exposed by using an EUV light source, and the exposed resist film for EUV may be developed to form the photoresist pattern MP26.

Figure 10C:
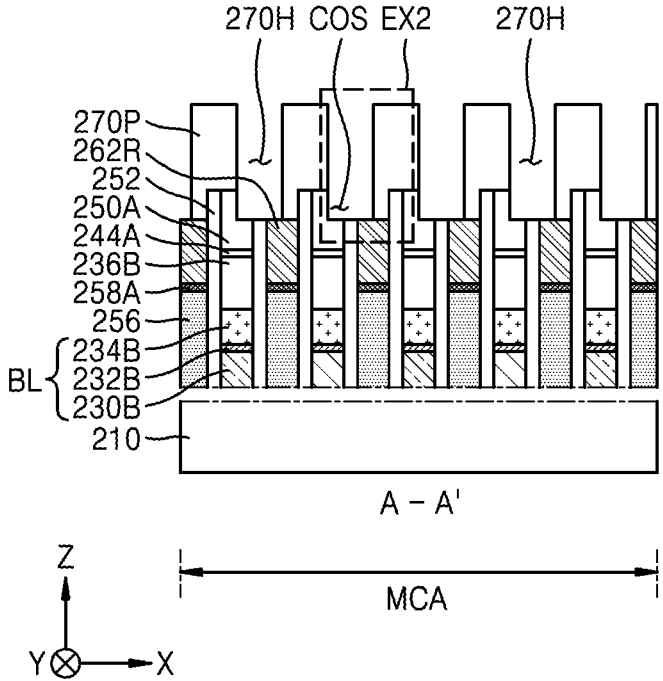

Referring to FIG. 10C, in the resultant structure of FIG. 10B, the upper hard mask layer ML4 and the lower hard mask layer ML3 may be sequentially etched by using the photoresist pattern MP26 as an etch mask. The insulating film 270 may be patterned by using, as an etch mask, the resultant structure obtained by the etching, and thus, an engraved insulating pattern 270P may be formed. Afterwards, unnecessary films may be removed from the engraved insulating pattern 270P to expose a top surface of the engraved insulating pattern 270P. The engraved insulating pattern 270P may be on the plurality of bit line structures and the plurality of recess contact plugs 262R, and be formed to have a plurality of openings 270H at positions shifted from the plurality of recess contact plugs 262R in a lateral direction.

Figure 11:
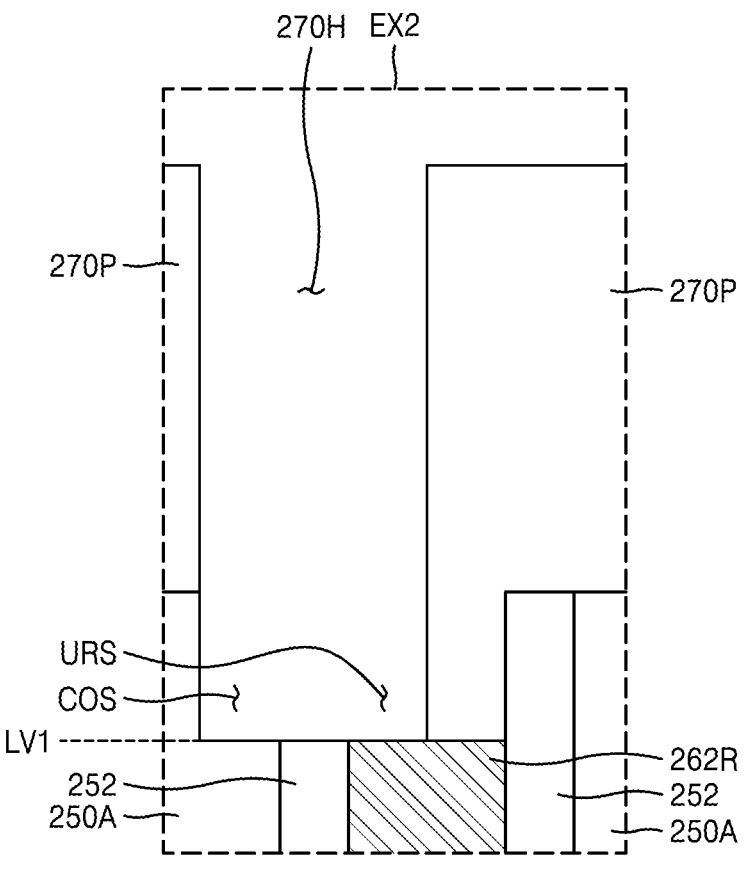
FIG. 11 is an enlarged cross-sectional view of region "EX2" of FIG. 10C.

FIG. 11 is an enlarged cross-sectional view of region "EX2" of FIG. 10C.

Referring to FIGS. 10C and 11, an engraved insulating pattern 270P may be formed to at least partially fill a portion of each of a plurality of recesses URS and at least partially cover a portion of each of a plurality of recess contact plugs 262R and a portion of each of an upper insulating capping pattern 250A and an insulating spacer 252, which are in each of a plurality of bit line structures. A portion of each of a plurality of upper insulating capping patterns 250A and a plurality of insulating spacers 252 and another portion of each of the plurality of recess contact plugs 262R may be exposed through a plurality of openings 270H of the engraved insulating pattern 270.

Thereafter, a portion of an upper corner of each of the plurality of upper insulating capping patterns 250A and a portion of each of the plurality of insulating spacers 252 may be removed through the plurality of openings 270H of the engraved insulating pattern 270P, and thus, a plurality of cutoff spaces COS may be formed. Each of the plurality of cutoff spaces COS may be formed at a position overlapping the bit line BL in a vertical direction (Z direction). The plurality of cutoff spaces COS may be connected to the plurality of openings 270H and the plurality of recesses (refer to URS in FIGS. 10A and 11).

In embodiments, after the plurality of cutoff spaces COS are formed, a bottom surface of each of the plurality of cutoff spaces COS and a top surface of portions of the plurality of recess contact plugs 262R that are exposed through the plurality of openings 270H may be at substantially the same vertical level LV1. In the plurality of cutoff spaces COS, a sidewall of each of the plurality of recess contact plugs 262R

(particularly, a sidewall facing the upper insulating capping pattern 250A) may not be exposed.

Figure 10D:
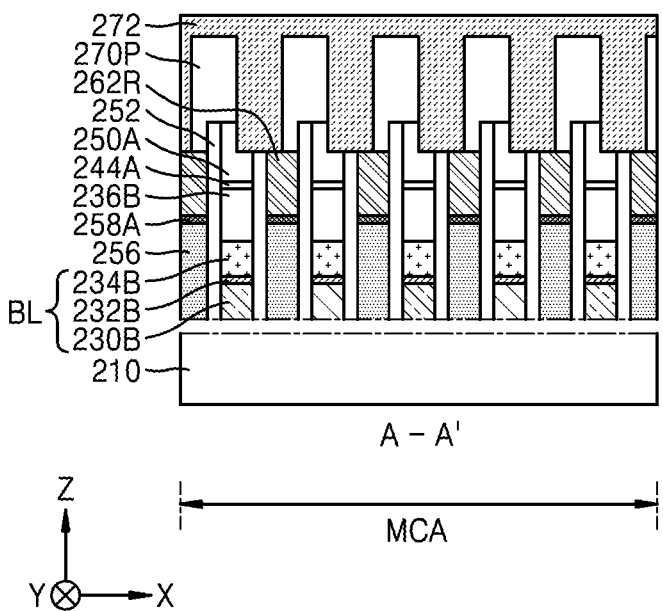

Referring to FIG. 10D, a conductive layer 272 may be formed on the resultant structure of FIG. 10C. The conductive layer 272 may be formed to at least partially fill the plurality of recesses (refer to URS in FIGS. 10A and 11) and the plurality of cutoff spaces (refer to COS in FIGS. 10C and 11) and contact a top surface of each of the plurality of recess contact plugs 262R.

The conductive layer 272 may include a metal, a conductive metal nitride, or a combination thereof. In embodiments, the conductive layer 272 may include titanium nitride (TiN), tungsten (W), or a combination thereof. In an example, the conductive layer 272 may include only a TiN film. In another example, the conductive layer 272 may include a stack structure of a TiN barrier film and a W film.

Figure 10E:
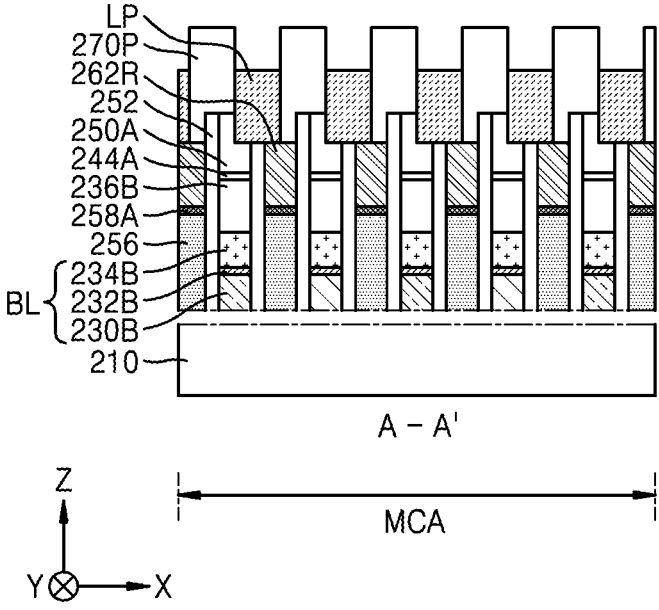

Referring to FIG. 10E, in the resultant structure of FIG. 10D, a plurality of conductive landing pads LP may be formed by etching the conductive layer 272. The plurality of conductive landing pads LP may at least partially fill the plurality of recesses (refer to URS in FIGS. 10A and 11) and the plurality of cutoff spaces (refer to COS in FIGS. 10C and 11) and contact the top surface of each of the plurality of recess contact plugs 262R. A top surface of each of the plurality of conductive landing pads LP may be closer to the substrate 210 than a top surface of the engraved insulating pattern 270P. Thus, after the plurality of conductive landing pads LP are formed, portions of the engraved insulating pattern 270P may protrude over the plurality of conductive landing pads LP.

Figure 10F:
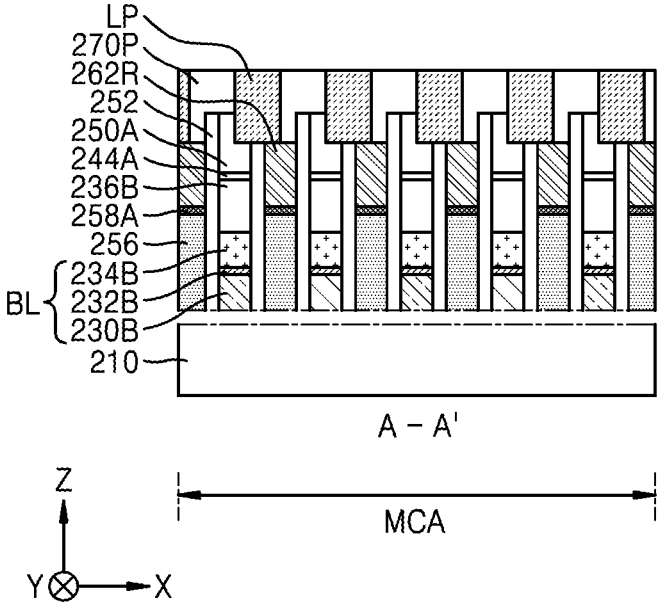

Referring to FIG. 10F, the engraved insulating pattern 270P may be partially removed from the resultant structure of FIG. 10E, and thus, the top surface of the engraved insulating pattern 270P may end up at the same vertical level (Z direction) as the top surface of each of the plurality of conductive landing pads LP.

In other embodiments, instead of the conductive landing pad LP shown in FIG. 10F, the conductive landing pad LP2 shown in FIG. 6, the conductive landing pad LP3 shown in FIG. 7, or the conductive landing pad LP4 shown in FIG. 8 may be formed.

Figure 12:
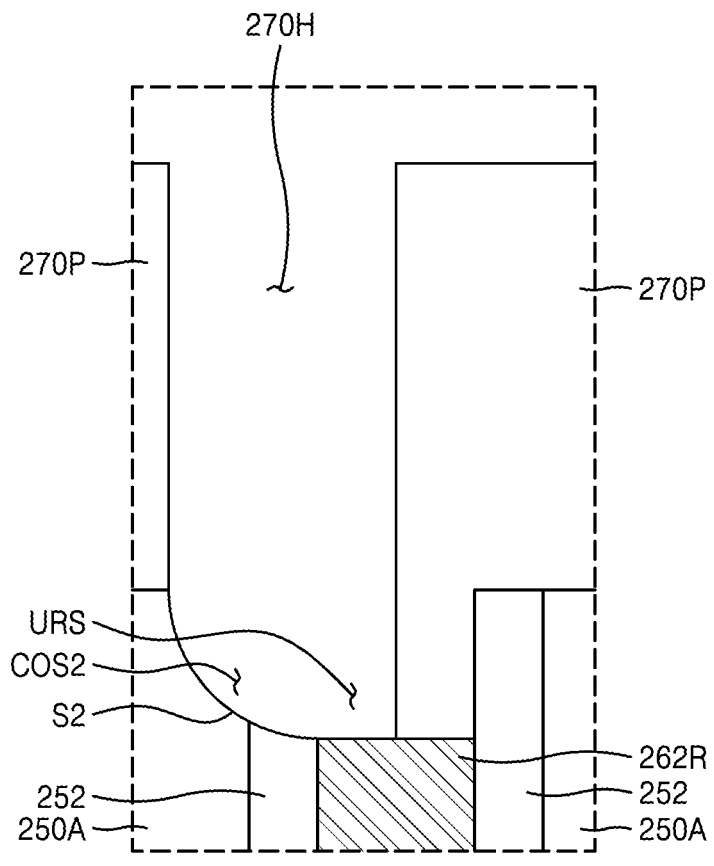
FIG. 12 is a cross-sectional view of a method of manufacturing an IC device, according to embodiments.

FIG. 12 is a cross-sectional view of a method of manufacturing an IC device, according to embodiments. FIG. 12 illustrates an enlarged cross-sectional configuration of a portion corresponding to region "EX2" of FIG. 10C. An example method of manufacturing the IC device 200 shown in FIG. 6 is described with reference to FIG. 12. In FIG. 12, the same reference numerals are used to denote the same elements as in FIGS. 9A to 11, and repeated descriptions thereof are omitted. The method of manufacturing the IC device 200 may be substantially the same as the method of manufacturing the IC device 100, which has been described with reference to FIGS. 9A to 11, and differences therebetween will mainly be described below.

Referring to FIG. 12, the processes described with reference to FIGS. 9A to 10C may be performed. However, in the present embodiment, a cutoff space COS2 may be formed instead of the cutoff space COS. The cutoff space COS2 may be formed by removing a portion of an upper corner of the upper insulating capping pattern 250A and a portion of the insulating spacer 252 through an opening 270H of an engraved insulating pattern 270P. After the cutoff space COS2 is formed, the upper insulating capping pattern 250A may have a round cutout surface S2 defining the cutoff space COS2. Subsequently, the processes described with reference to FIGS. 10D to 10F may be performed to manufacture the IC device 200 shown in FIG. 6.

Figure 13:
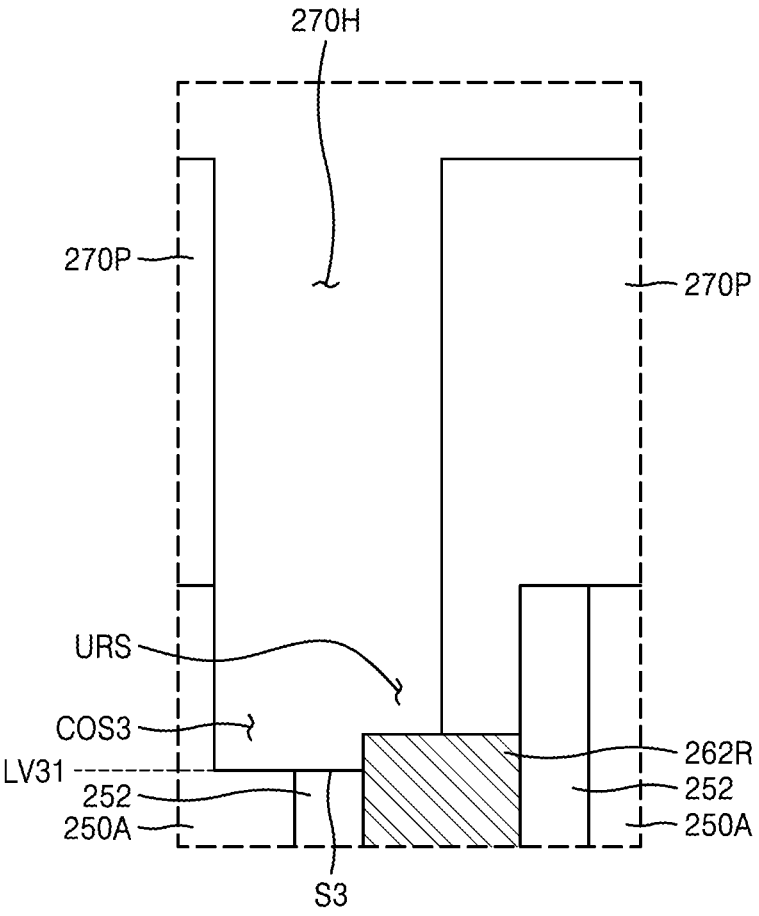
FIG. 13 is a cross-sectional view of a method of manufacturing an IC device, according to embodiments.

FIG. 13 is a cross-sectional view of a method of manufacturing an IC device, according to embodiments. FIG. 13 illustrates an enlarged cross-sectional configuration of a portion corresponding to region "EX2" of FIG. 10C. An example method of manufacturing the IC device 300 shown in FIG. 7 is described with reference to FIG. 13. In FIG. 13, the same reference numerals are used to denote the same elements as in FIGS. 9A to 11, and repeated descriptions thereof are omitted. The method of manufacturing the IC device 300 may be substantially the same as the method of manufacturing the IC device 100, which has been described with reference to FIGS. 9A to 11, and differences therebetween will mainly be described below.

Referring to FIG. 13, the processes described with reference to FIGS. 9A to 10C may be performed. However, in the present embodiment, a cutoff space COS3 may be formed instead of the cutoff space COS. The cutoff space COS3 may be formed by removing a portion of an upper corner of an upper insulating capping pattern 250A and a portion of an insulating spacer through an opening 270H of an engraved insulating pattern 270P. The upper insulating capping pattern 250A and the insulating spacer 252 may have a flat surface S3 defining a bottom surface of the cutoff space COS3. The flat surface S3 may extend substantially planar at a vertical level LV31. Subsequently, the processes described with reference to FIGS. 10D to 10F may be performed to manufacture the IC device 300 shown in FIG. 7.

Figure 14:
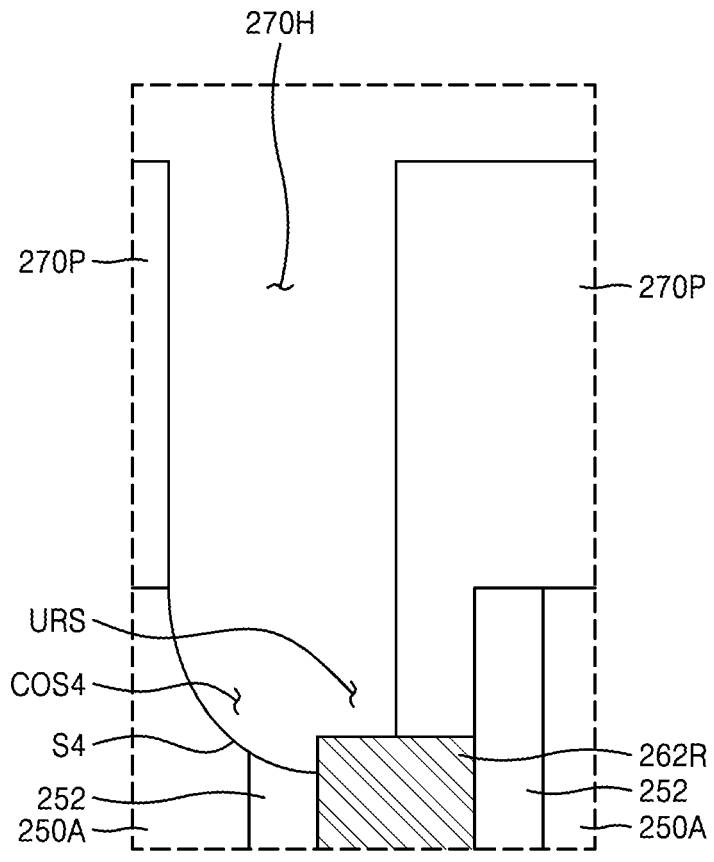
FIG. 14 is a cross-sectional view of a method of manufacturing an IC device, according to embodiments.

FIG. 14 is a cross-sectional view of a method of manufacturing an IC device, according to embodiments. FIG. 14 illustrates an enlarged cross-sectional configuration of a portion corresponding to region "EX2" of FIG. 10C. An example method of manufacturing the IC device 400 shown in FIG. 8 is described with reference to FIG. 14. In FIG. 14, the same reference numerals are used to denote the same elements as in FIGS. 9A to 11, and repeated descriptions thereof are omitted. The method of manufacturing the IC device 400 may be substantially similar to the method of manufacturing the IC device 100, which has been described with reference to FIGS. 9A to 11, and differences therebetween will mainly be described below.

Referring to FIG. 14, the processes described with reference to FIGS. 9A to 10C may be performed. However, in the present embodiment, a cutoff space COS4 may be formed instead of the cutoff space COS. The cutoff space COS4 may be formed by removing a portion of an upper corner of an upper insulating capping pattern 250A and a portion of an insulating spacer 252 through an opening 270H of an engraved insulating pattern 270P. The upper insulating capping pattern 250A may have a round cutout surface S4 defining the cutoff space COS4. Subsequently, the processes described with reference to FIGS. 10D to 10F may be performed to manufacture the IC device 200 shown in FIG. 6.

FIGS. 15A to 15F are cross-sectional views of a process sequence of a method of manufacturing an IC device, according to embodiments. Another example method of manufacturing the IC device 100 shown in FIGS. 4A, 4B, and 5 is described with reference to FIGS. 15A to 15F. In FIGS. 15A to 15F, the same reference numerals are used to denote the same elements as in FIGS. 4A to 10F, and repeated descriptions thereof are omitted.

Figure 15A:
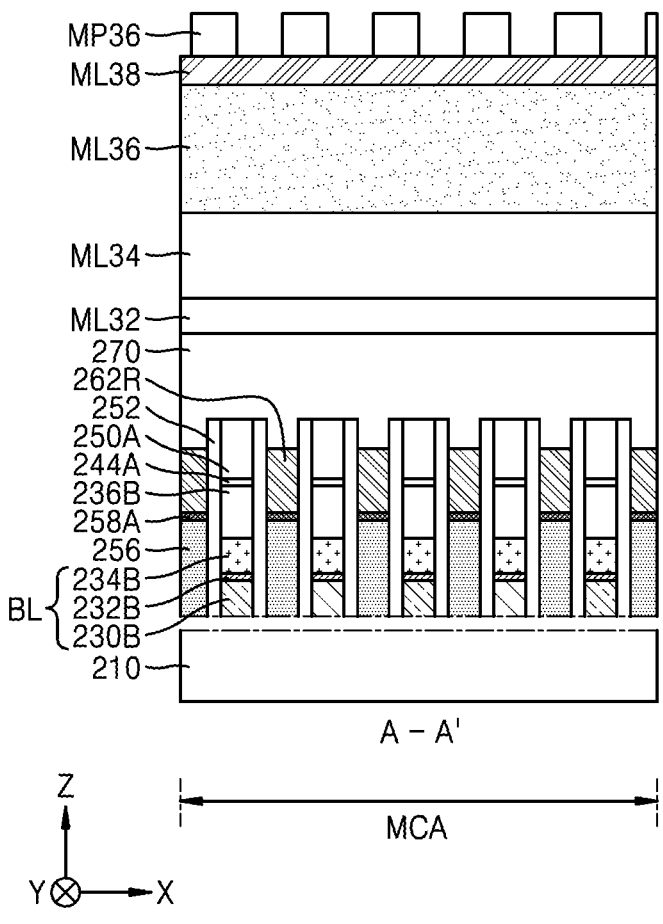
FIGS. 15A to 15F are cross-sectional views of a process sequence of a method of manufacturing an IC device, according to embodiments.

Referring to FIG. 15A, the processes described with reference to FIGS. 9A to 9L may be performed, and a plurality of recess contact plugs 262R and a recess space URS may be formed as described with reference to FIG.

10A. Thereafter, an insulating film 270 may be formed as described with reference to FIG. 10B.

A first hard mask layer ML32, a second hard mask layer ML34, a third hard mask layer ML36, and a fourth hard mask layer ML38 may be formed on the insulating film 270, and a photoresist pattern MP36 may be formed on the fourth hard mask layer ML38.

The first hard mask layer ML32 may include a polysilicon film, the second hard mask layer ML34 may include a silicon oxide film, the third hard mask layer ML36 may include an amorphous carbon layer (ACL), and the fourth hard mask layer ML38 may include a polysilicon film, without being limited thereto.

The photoresist pattern MP36 may be formed from a resist film for EUV (13.5 nm), a resist film for KrF excimer laser (248 nm), a resist film for ArF excimer laser (193 nm), or a resist film for $F_2$ excimer laser (157 nm). In embodiments, to form the photoresist pattern MP36, a resist film for EUV may be formed on the fourth hard mask layer ML38. Thereafter, the resist film for EUV may be exposed by using an EUV light source, and the exposed resist film for EUV may be developed to form the photoresist pattern MP36.

Figure 15B:
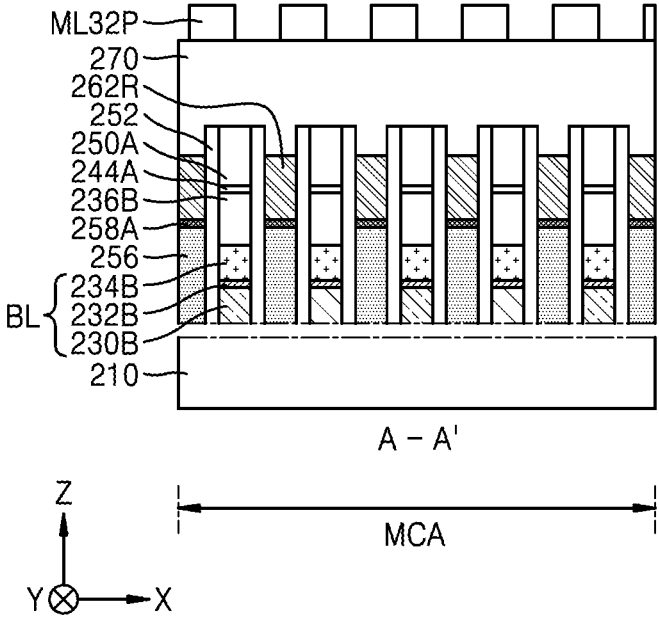

Referring to FIG. 15B, in the resultant structure of FIG. 15A, the fourth hard mask layer ML38, the third hard mask layer ML36, the second hard mask layer ML34, and the first hard mask layer ML32 may be etched by using the photoresist pattern MP36 as an etch mask. As a result, a first hard mask pattern ML32P may remain on the insulating film 270.

Figure 15C:
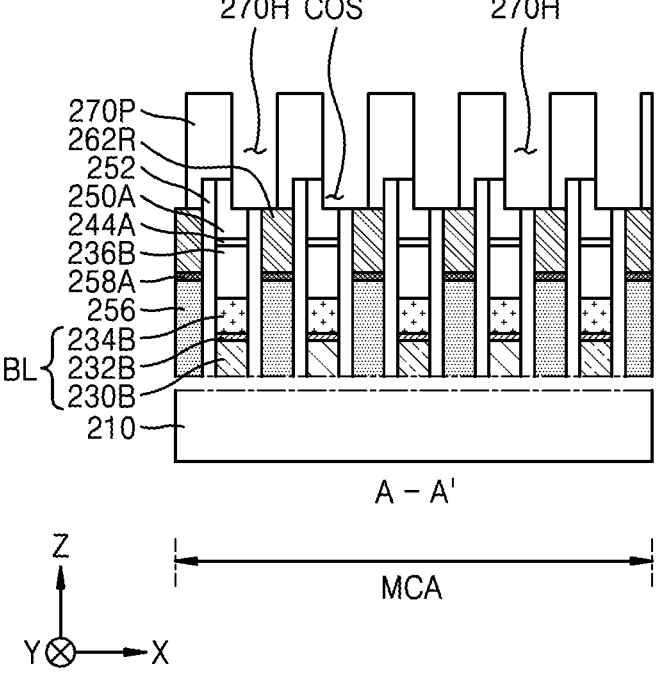

Referring to FIG. 15C, in the resultant structure of FIG. 15B, the insulating film 270 may be patterned by using the first hard mask pattern ML32P as an etch mask, and thus, an engraved insulating pattern 270P may be formed. Thereafter, unnecessary films on the engraved insulating pattern 270P may be removed to expose a top surface of the engraved insulating pattern 270P. The engraved insulating pattern 270P may be formed to have a plurality of openings 270H.

Afterwards, a portion of an upper corner of each of a plurality of upper insulating capping patterns 250A and a portion of each of the plurality of insulating spacers 252 may be removed through the plurality of openings 270H of the engraved insulating pattern 270P, and thus, a plurality of cutoff spaces COS may be formed.

Figure 15D:
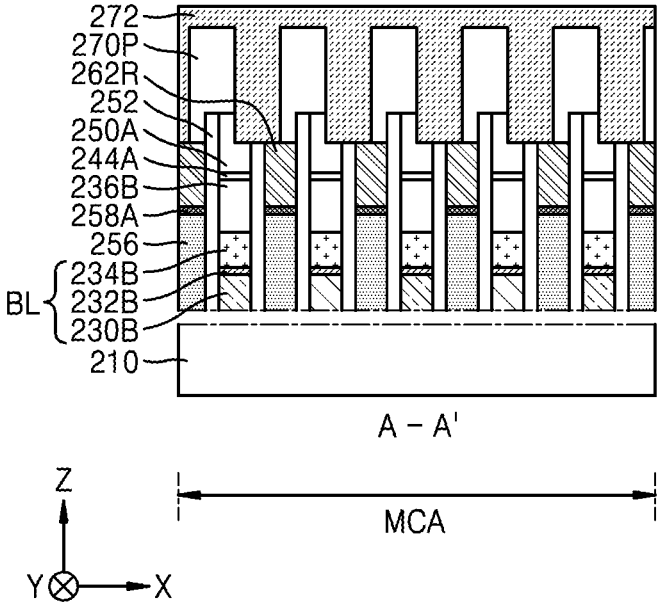

Referring to FIG. 15D, a conductive layer 272 may be formed on the resultant structure of FIG. 15C, by using a method similar to that described with reference to FIG. 10D.

Figure 15E:
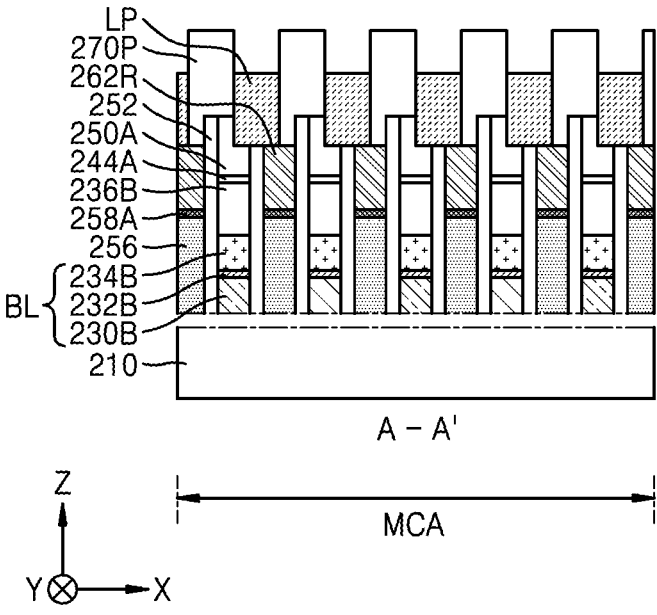

Referring to FIG. 15E, by using a method similar to that described with reference to FIG. 10E, the conductive layer 272 may be etched back in the resultant structure of FIG. 15D to form a plurality of conductive landing pads LP. After the plurality of conductive landing pads LP are formed, portions of the engraved insulating pattern 270P may protrude over the plurality of conductive landing pads LP.

Figure 15F:
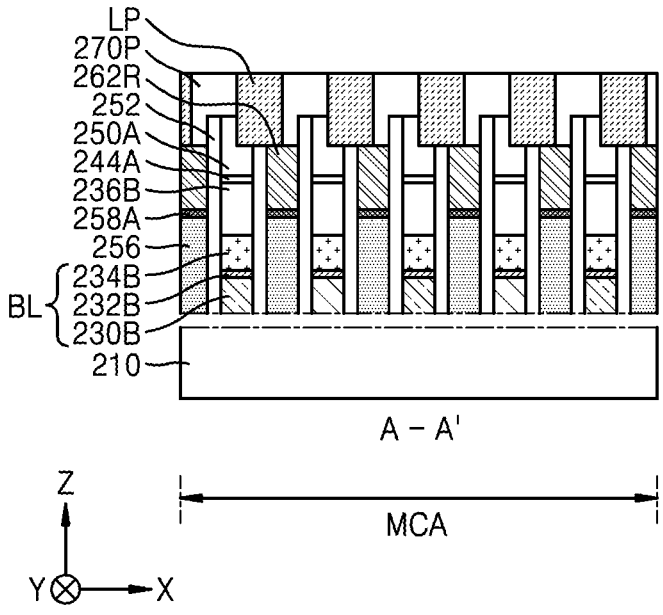

Referring to FIG. 15F, by using a method similar to that described with reference to FIG. 10F, the engraved insulating pattern 270P may be partially removed from the resultant structure of FIG. 15E, and thus, the top surface of the engraved insulating pattern 270P may come to be at the same vertical level (Z direction) as a top surface of each of the plurality of conductive landing pads LP.

In other embodiments, instead of the conductive landing pad LP shown in FIG. 15F, the conductive landing pad LP2 shown in FIG. 6, the conductive landing pad LP3 shown in FIG. 7, or the conductive landing pad LP4 shown in FIG. 8 may be formed.

In the example methods of manufacturing the IC devices, which have been described with reference to FIGS. 9A to 15F, an engraved patterning technique may be used to form a plurality of conductive landing pads (e.g., LP, LP2, LP3, and LP4) in the cell array region MCA having a relatively high pattern density. In addition, a series of processes for forming the plurality of conductive landing pads LP, LP2, LP3, and LP4 may include a photolithography process using an EUV light source. In the methods of manufacturing IC devices, according to the inventive concept, the occurrence of process failures may be reduced and a process margin may be increased or maximized by using a relatively simplified process, and thus, the reliability of the IC devices may be improved.

Furthermore, in the methods of manufacturing IC devices according to the inventive concept, the conductive landing pads LP, LP2, LP3, and LP4 may be formed using the engraved patterning technique in the cell array region MCA. Therefore, even after the conductive landing pads LP, LP2, LP3, and LP4 are densely formed at a relatively small pitch, pattern failures may be reduced or prevented. For example, the conductive landing pads LP, LP2, LP3, and LP4 may be prevented from sticking to each other, and some of the conductive landing pads LP, LP2, LP3, and LP4 may be prevented from being cut. Accordingly, the reliability of IC devices may be improved.

While the inventive concept has been particularly shown and described with reference to embodiments, thereof, it will be understood that various changes in form and details may be made therein without departing from the spirit and scope of the following claims.

What is claimed is:

1. An integrated circuit device comprising:

a bit line on a substrate;

an insulating capping pattern on a top surface of the bit line, the insulating capping pattern having an upper cutout portion apart from the bit line in a vertical direction perpendicular to a top surface of the substrate;

an insulating spacer on a sidewall of each of the bit line and the insulating capping pattern;

a lower contact plug connected to an active region of the substrate, the lower contact plug being apart from the bit line in a first lateral direction perpendicular to the vertical direction with the insulating spacer therebetween;

a recess contact plug connected to the lower contact plug on the lower contact plug, the recess contact plug being apart from the insulating capping pattern in the first lateral direction with the insulating spacer therebetween;

an engraved insulating pattern on the insulating capping pattern and the recess contact plug, the engraved insulating pattern having a first portion, a second portion, and an opening, the first portion being in contact with a top surface of a region of the insulating capping pattern, except for the upper cutout portion, the second portion being on a first portion of a top surface of the recess contact plug, and the opening being defined by the first portion and the second portion; and a conductive landing pad in the opening of the engraved insulating pattern, the conductive landing pad having a lower corner portion in contact with the upper cutout portion of the insulating capping pattern and a surface in contact with a second portion of the top surface of the recess contact plug.

2. The integrated circuit device of claim 1, wherein, in a portion adjacent to an interface between the engraved insulating pattern and the insulating capping pattern, a sidewall of the first portion of the engraved insulating pattern and the upper cutout portion of the insulating capping pattern extend in a straight line, and wherein the conductive landing pad is in contact with the sidewall of the first portion of the engraved insulating pattern and the upper cutout portion of the insulating capping pattern in the portion adjacent to the interface between the engraved insulating pattern and the insulating capping pattern.

3. The integrated circuit device of claim 1, wherein the lower corner portion of the conductive landing pad has a convex shape toward the upper cutout portion of the insulating capping pattern, and wherein the upper cutout portion of the insulating capping pattern has a shape corresponding to the lower corner portion and has a concave shape toward the lower corner portion.

4. The integrated circuit device of claim 1, wherein the lower corner portion of the conductive landing pad has a convex round shape toward the upper cutout portion of the insulating capping pattern, and the upper cutout portion of the insulating capping pattern has a shape corresponding to the lower corner portion and has a concave round shape toward the lower corner portion.

5. The integrated circuit device of claim 1, wherein a bottom surface of the conductive landing pad is at a same vertical level as a top surface of the recess contact plug.

6. The integrated circuit device of claim 1, wherein a vertical level of a lowermost surface of the conductive landing pad is closer to the substrate than a vertical level of an uppermost surface of the recess contact plug, and the conductive landing pad is on a top surface and a sidewall of the recess contact plug.

7. The integrated circuit device of claim 1, wherein the conductive landing pad comprises a pad dent portion bordering an upper corner portion of the recess contact plug.

8. An integrated circuit device comprising:

a plurality of bit line structures parallel to each other on a substrate, each bit line structure comprising a bit line, an insulating capping pattern, and an insulating spacer, the insulating capping pattern being on a top surface of the bit line and having an upper cutout portion apart from the bit line in a vertical direction perpendicular to a top surface of the substrate, and the insulating spacer being on a sidewall of each of the bit line and the insulating capping pattern;

a plurality of lower contact plugs connected to an active region of the substrate, the plurality of lower contact plugs being between the plurality of bit line structures, respectively;

a plurality of recess contact plugs on the plurality of lower contact plugs between the plurality of bit line structures, respectively, the plurality of recess contact plugs being connected to the plurality of lower contact plugs, respectively;

an engraved insulating pattern on the plurality of bit line structures and the plurality of recess contact plugs, the engraved insulating pattern having a plurality of openings; and a plurality of conductive landing pads inside the plurality of openings of the engraved insulating pattern, the plurality of conductive landing pads being connected to the plurality of recess contact plugs, respectively, wherein each of the plurality of conductive landing pads comprises a lower corner portion and a conductive landing pad, the lower corner portion being in contact with the upper cutout portion of the insulating capping pattern included in a selected one of the plurality of bit line structures, the conductive landing pad having a surface in contact with a top surface of a selected one of the plurality of recess contact plugs.

9. The integrated circuit device of claim 8, wherein the engraved insulating pattern comprises a first portion and a second portion, the first portion being in contact with a portion of a top surface of each of the plurality of bit line structures, the second portion being in contact with a portion of a top surface of each of the plurality of recess contact plugs, and a vertical level of a lowermost surface of the second portion is closer to the substrate than a vertical level of a lowermost surface of the first portion.

10. The integrated circuit device of claim 8, wherein a vertical level of a lowermost surface of each of the plurality of conductive landing pads is closer to the substrate than a vertical level of an uppermost surface of each of the plurality of bit line structures.

11. The integrated circuit device of claim 8, wherein the lower corner portion of each of the plurality of conductive landing pads has a convex shape toward the upper cutout portion of the insulating capping pattern, and wherein the upper cutout portion of the insulating capping pattern of each of the plurality of bit line structures has a shape corresponding to the lower corner portion and has a concave shape toward the lower corner portion.

12. The integrated circuit device of claim 8, wherein the lower corner portion of each of the plurality of conductive landing pads has a convex round shape toward the upper cutout portion of the insulating capping pattern, and wherein the upper cutout portion of the insulating capping pattern of each of the plurality of bit line structures has a shape corresponding to the lower corner portion and has a concave round shape toward the lower corner portion.

13. The integrated circuit device of claim 8, wherein a bottom surface of each of the plurality of conductive landing pads is at a same vertical level as a top surface of each of the plurality of recess contact plugs.

14. The integrated circuit device of claim 8, wherein a vertical level of a lowermost surface of each of the plurality of conductive landing pads is closer to the substrate than a vertical level of an uppermost surface of each of the plurality of recess contact plugs, and each of the plurality of conductive landing pads is on a top surface and a sidewall of a selected one of the plurality of recess contact plugs.

15. The integrated circuit device of claim 8, wherein each of the plurality of conductive landing pads comprises a pad dent portion bordering an upper corner portion of a selected one of the plurality of recess contact plugs.

16. An integrated circuit device comprising:

a lower contact plug on a substrate, the lower contact plug being connected to an active region of the substrate;

a pair of bit lines on both sides, respectively, of the lower contact plug at positions apart from the lower contact plug in a first lateral direction, the pair of bit lines extending lengthwise in a second lateral direction, wherein the second lateral direction intersects with the first lateral direction;

a pair of insulating capping patterns on top surfaces of the pair of bit lines;

a pair of insulating spacers on both sides of the lower contact plug, respectively, the pair of insulating spacers being on sidewalls of the pair of bit lines and sidewalls of the pair of insulating capping patterns, respectively;

a recess contact plug connected to the lower contact plug on the lower contact plug, the recess contact plug being apart from the pair of insulating capping patterns in the first lateral direction;

an engraved insulating pattern on the pair of insulating capping patterns, the pair of insulating spacers, and the recess contact plug, the engraved insulating pattern having an opening at a position overlapping each of a portion of a first insulating capping pattern selected from the pair of insulating capping patterns and a portion of the recess contact plug in a vertical direction, the vertical direction being perpendicular to a top surface of the substrate and being perpendicular to the first and second lateral directions; and a conductive landing pad in the opening of the engraved insulating pattern, the conductive landing pad having a lowermost surface that is closer to the substrate than an uppermost surface of the pair of insulating capping patterns, wherein the first insulating capping pattern comprises an upper cutout portion that is apart from the bit line in the vertical direction, the upper cutout portion being concave toward the conductive landing pad, wherein the conductive landing pad is in contact with the upper cutout portion of the first insulating capping pattern and comprises a lower corner portion and a surface that is in contact with a top surface of the recess contact plug, wherein the lower corner portion has a shape corresponding to the upper cutout portion of the first insulating capping pattern and is convex toward the upper cutout portion.

17. The integrated circuit device of claim 16, wherein the conductive landing pad is in contact with a sidewall of the recess contact plug, which faces the first insulating capping pattern.

18. The integrated circuit device of claim 16, wherein a first vertical distance from a bottom surface of the conductive landing pad to the substrate is equal to or less than a second vertical distance from a top surface of the recess contact plug to the substrate.

19. The integrated circuit device of claim 16, wherein the recess contact plug and the conductive landing pad comprise a same metal.

20. The integrated circuit device of claim 16, wherein the recess contact plug and the conductive landing pad comprise different metals from each other.

* * * * *